(12) United States Patent
Wang et al.

US008779685B2

(10) Patent No.: US 8,779,685 B2
(45) Date of Patent: Jul. 15, 2014

(54) HIGH CRI WHITE LIGHT EMITTING DEVICES AND DRIVE CIRCUITRY

(75) Inventors: Gang Wang, Milpitas, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 650 days.

(21) Appl. No.: 12/945,641

(22) Filed: Nov. 12, 2010

(65) Prior Publication Data

US 2011/0115406 A1 May 19, 2011

Related U.S. Application Data

(60) Provisional application No. 61/262,855, filed on Nov. 19, 2009.

(51) Int. Cl.
*H05B 37/02* (2006.01)
(52) U.S. Cl.
USPC ............. 315/294; 315/307; 315/312; 315/32
(58) Field of Classification Search
USPC ............... 315/32, 50, 51, 112, 113, 117, 118, 315/185 R, 291, 294, 297, 307, 311, 31, 2
See application file for complete search history.

(56) References Cited

U.S. PATENT DOCUMENTS

| 3,290,255 | A | 12/1966 | Smith |
| 3,593,055 | A | 7/1971 | Geusic et al. |
| 3,670,193 | A | 6/1972 | Thorington et al. |
| 3,676,668 | A | 7/1972 | Collins et al. |
| 3,691,482 | A | 9/1972 | Pinnow et al. |
| 3,709,685 | A | 1/1973 | Hercock et al. |
| 3,743,833 | A | 7/1973 | Martie et al. |
| 3,763,405 | A | 10/1973 | Mitsuhata |

(Continued)

FOREIGN PATENT DOCUMENTS

| EP | 647694 | 4/1995 |
| GB | 2 017 409 | 10/1979 |

(Continued)

OTHER PUBLICATIONS

International Preliminary Report dated May 31, 2012 for International PCT Application No. PCT/US10/56893, 9 pages.

(Continued)

*Primary Examiner* — Douglas W Owens
*Assistant Examiner* — Jianzi Chen
(74) *Attorney, Agent, or Firm* — Vista IP Law Group, LLP

(57) ABSTRACT

A high CRI white light emitting device comprises: a blue solid state light emitter (LED) operable to generate blue light; a phosphor material operable to absorb a portion of the blue light and to emit green/yellow light and a red solid state light emitter (LED) operable to generate red light. The emission product of the device comprises the combined light generated by the blue and red LEDs and green/yellow light generated by the phosphor material and appears white in color. The device further comprises a drive circuit operable to compensate for variation in the ratio (relative contribution) of red to blue light in the emission product such as to ensure that said variation is less than 20% over an operating temperature range of at least 25° C. The drive circuit can reduce variation in the CRI and CCT of the device's emission product over the operating temperature range.

29 Claims, 22 Drawing Sheets

(56) References Cited

U.S. PATENT DOCUMENTS

| | | |
|---|---|---|
| 3,793,046 A | 2/1974 | Wanmaker et al. |
| 3,819,973 A | 6/1974 | Hosford |
| 3,819,974 A | 6/1974 | Stevenson et al. |
| 3,849,707 A | 11/1974 | Braslau et al. |
| 3,875,456 A | 4/1975 | Kana et al. |
| 3,932,881 A | 1/1976 | Mita et al. |
| 3,937,998 A | 2/1976 | Verstegen et al. |
| 3,972,717 A | 8/1976 | Wiedemann |
| 4,047,075 A | 9/1977 | Schober! |
| 4,075,532 A | 2/1978 | Piper et al. |
| 4,081,764 A | 3/1978 | Christmann et al. |
| 4,104,076 A | 8/1978 | Pons |
| 4,143,394 A | 3/1979 | Schoeberl |
| 4,176,294 A | 11/1979 | Thornton, Jr. |
| 4,176,299 A | 11/1979 | Thornton |
| 4,211,955 A | 7/1980 | Ray |
| 4,305,019 A | 12/1981 | Graff et al. |
| 4,315,192 A | 2/1982 | Skwirut et al. |
| 4,443,532 A | 4/1984 | Joy et al. |
| 4,559,470 A | 12/1985 | Murakami et al. |
| 4,573,766 A | 3/1986 | Bournay, Jr. et al. |
| 4,618,555 A | 10/1986 | Suzuki et al. |
| 4,638,214 A | 1/1987 | Beers et al. |
| 4,667,036 A | 5/1987 | Iden et al. |
| 4,678,285 A | 7/1987 | Ohta et al. |
| 4,727,003 A | 2/1988 | Ohseto et al. |
| 4,772,885 A | 9/1988 | Uehara et al. |
| 4,845,223 A | 7/1989 | Seybold et al. |
| 4,859,539 A | 8/1989 | Tomko et al. |
| 4,915,478 A | 4/1990 | Lenko et al. |
| 4,918,497 A | 4/1990 | Edmond |
| 4,946,621 A | 8/1990 | Fouassier et al. |
| 4,992,704 A | 2/1991 | Stinson |
| 5,077,161 A | 12/1991 | Law |
| 5,110,931 A | 5/1992 | Dietz et al. |
| 5,126,214 A | 6/1992 | Tokailin et al. |
| 5,131,916 A | 7/1992 | Eichenauer et al. |
| 5,143,433 A | 9/1992 | Farrell |
| 5,143,438 A | 9/1992 | Giddens et al. |
| 5,166,761 A | 11/1992 | Olson et al. |
| 5,208,462 A | 5/1993 | O'Connor et al. |
| 5,210,051 A | 5/1993 | Carter, Jr. |
| 5,211,467 A | 5/1993 | Seder |
| 5,237,182 A | 8/1993 | Kitagawa et al. |
| 5,264,034 A | 11/1993 | Dietz et al. |
| 5,283,425 A | 2/1994 | Imamura |
| 5,369,289 A | 11/1994 | Tamaki et al. |
| 5,405,709 A | 4/1995 | Littman et al. |
| 5,439,971 A | 8/1995 | Hyche |
| 5,518,808 A | 5/1996 | Bruno et al. |
| 5,535,230 A | 7/1996 | Abe |
| 5,557,168 A | 9/1996 | Nakajima et al. |
| 5,563,621 A | 10/1996 | Silsby |
| 5,578,839 A | 11/1996 | Nakamura et al. |
| 5,583,349 A | 12/1996 | Norman et al. |
| 5,585,640 A | 12/1996 | Huston et al. |
| 5,619,356 A | 4/1997 | Kozo et al. |
| 5,660,461 A | 8/1997 | Ignatius et al. |
| 5,677,417 A | 10/1997 | Muellen et al. |
| 5,679,152 A | 10/1997 | Tischler et al. |
| 5,763,901 A | 6/1998 | Komoto et al. |
| 5,770,887 A | 6/1998 | Tadatomo et al. |
| 5,771,039 A | 6/1998 | Ditzik |
| 5,777,350 A | 7/1998 | Nakamura et al. |
| 5,869,199 A | 2/1999 | Kido |
| 5,959,316 A | 9/1999 | Lowery |
| 5,962,971 A | 10/1999 | Chen |
| 5,998,925 A | 12/1999 | Shimizu |
| 6,137,217 A | 10/2000 | Pappalardo et al. |
| 6,161,910 A | 12/2000 | Reisenauer et al. |
| 6,340,824 B1 | 1/2002 | Komoto et al. |
| 6,441,558 B1 | 8/2002 | Muthu |
| 6,504,301 B1 | 1/2003 | Lowery |
| 6,513,949 B1 | 2/2003 | Marshall |
| 6,576,488 B2 | 6/2003 | Collins et al. |
| 6,577,073 B2 | 6/2003 | Shimizu |
| 6,600,175 B1 | 7/2003 | Baretz et al. |
| 6,636,003 B2 * | 10/2003 | Rahm et al. .................. 315/179 |
| 6,642,618 B2 | 11/2003 | Yagi et al. |
| 6,642,652 B2 | 11/2003 | Collins et al. |
| 6,692,136 B2 | 2/2004 | Marshall |
| 6,869,812 B1 | 3/2005 | Liu |
| 7,153,015 B2 | 12/2006 | Brukilacchio |
| 7,213,940 B1 | 5/2007 | Van De Ven |
| 7,311,858 B2 | 12/2007 | Wang |
| 7,358,929 B2 | 4/2008 | Mueller et al. |
| 7,390,437 B2 | 6/2008 | Dong et al. |
| 7,479,662 B2 | 1/2009 | Soules et al. |
| 7,541,728 B2 | 6/2009 | Wang et al. |
| 7,575,697 B2 | 8/2009 | Li |
| 7,601,276 B2 | 10/2009 | Li |
| 7,615,795 B2 | 11/2009 | Baretz et al. |
| 7,648,650 B2 | 1/2010 | Liu et al. |
| 7,655,156 B2 | 2/2010 | Cheng |
| 7,703,943 B2 | 4/2010 | Li et al. |
| 7,943,945 B2 | 5/2011 | Baretz et al. |
| 8,159,155 B2 | 4/2012 | Deurenberg |
| 2002/0130786 A1 | 9/2002 | Weindorf |
| 2003/0076056 A1 | 4/2003 | Schuurmans |
| 2004/0016938 A1 | 1/2004 | Baretz et al. |
| 2004/0239243 A1 | 12/2004 | Roberts et al. |
| 2005/0093792 A1 | 5/2005 | Yamamoto et al. |
| 2006/0038511 A1 | 2/2006 | Tagawa |
| 2006/0049416 A1 | 3/2006 | Baretz et al. |
| 2006/0103612 A1 | 5/2006 | Ozaki |
| 2006/0109137 A1 | 5/2006 | Callahan |
| 2006/0158090 A1 | 7/2006 | Wang et al. |
| 2006/0158881 A1 | 7/2006 | Dowling |
| 2007/0047262 A1 | 3/2007 | Schardt et al. |
| 2007/0171159 A1 | 7/2007 | Lee |
| 2007/0216704 A1 | 9/2007 | Roberts |
| 2007/0236628 A1 | 10/2007 | Epstein |
| 2008/0068859 A1 | 3/2008 | Ng et al. |
| 2008/0088244 A1 | 4/2008 | Morishita |
| 2008/0103714 A1 | 5/2008 | Aldrich et al. |
| 2008/0111472 A1 | 5/2008 | Liu et al. |
| 2008/0136313 A1 | 6/2008 | Van De Ven et al. |
| 2008/0217512 A1 | 9/2008 | Schulz |
| 2008/0224597 A1 | 9/2008 | Baretz et al. |
| 2008/0224598 A1 | 9/2008 | Baretz et al. |
| 2008/0238340 A1 * | 10/2008 | Leung et al. .................. 315/297 |
| 2008/0246419 A1 | 10/2008 | Deurenberg |
| 2009/0001399 A1 | 1/2009 | Diana et al. |
| 2009/0091265 A1 | 4/2009 | Song et al. |
| 2009/0184616 A1 | 7/2009 | Van De Ven et al. |
| 2009/0273918 A1 | 11/2009 | Falicoff et al. |
| 2009/0283721 A1 | 11/2009 | Liu et al. |
| 2009/0294780 A1 | 12/2009 | Chou et al. |
| 2010/0002440 A1 | 1/2010 | Negley et al. |
| 2010/0079059 A1 | 4/2010 | Roberts et al. |
| 2010/0127283 A1 | 5/2010 | van de Ven |
| 2010/0140633 A1 | 6/2010 | Emerson |
| 2010/0308712 A1 | 12/2010 | Liu et al. |
| 2011/0042554 A1 * | 2/2011 | Hilgers et al. .................. 250/215 |

FOREIGN PATENT DOCUMENTS

| | | |
|---|---|---|
| JP | S50-79379 | 11/1973 |
| JP | 60170194 | 9/1985 |
| JP | 862-189770 | 8/1987 |
| JP | H01-1794 71 | 7/1989 |
| JP | 01-260707 | 10/1989 |
| JP | H02-91980 | 3/1990 |
| JP | H3-24692 | 3/1991 |
| JP | 4010665 | 1/1992 |
| JP | 4010666 | 1/1992 |
| JP | 04-289691 | 10/1992 |
| JP | 4-321280 | 11/1992 |
| JP | 05-152609 | 6/1993 |
| JP | 6207170 | 7/1994 |
| JP | 6-267301 | 9/1994 |
| JP | 6283755 | 10/1994 |
| JP | 07-099345 | 4/1995 |
| JP | H07-176794 | 7/1995 |

(56) References Cited

FOREIGN PATENT DOCUMENTS

| JP | 07-235207 | 9/1995 |
|---|---|---|
| JP | H7-282609 | 10/1995 |
| JP | H08-7614 | 1/1996 |
| JP | 8-250281 | 9/1996 |
| JP | 2900928 | 3/1999 |
| JP | P2003-234513 | 8/2003 |
| JP | P3724490 | 9/2005 |
| JP | P3724498 | 9/2005 |
| JP | 2008-085026 A | 4/2008 |
| WO | WO 9108508 | 6/1991 |

OTHER PUBLICATIONS

International Search Report and Written Opinion dated Oct. 17, 2011 for International PCT Application No. PCT/US11/41264, 18 pages.
International Preliminary Report dated Jan. 10, 2013 for International PCT Application No. PCT/US11/41264, 10 pages.
International Search Report and Written Opinion dated Dec. 13, 2011 for International PCT Application No. PCT/US11/46964, 11 pages.
International Search Report and Written Opinion dated Jan. 27, 2011 for International Application No. PCT/US2010/056893.
"Fraunhofer-Gesellschafl: Research News Special1997", http://www.fhg.de/press/md-e/md1997/sondert2.hlm,(accessed on Jul. 23, 1998), Jan. 1997, Publisher: Fraunhofer Institute.
Adachi, C. et al., "Blue light-emitting organic electroluminescent devices", "Appl. Phys. Lett.", Feb. 26, 1990, pp. 799-801, vol. 56, No. 9.
Akasaki, Isamu, et al., "Photoluminescence of Mg-doped p-type GaN and electroluminescence of GaN p-n junction LED", "Journal of Luminescence", Jan.-Feb. 1991, pp. 666-670, vol. 48-49 pt. 2.
Amano, H., et al., "UV and blue electroluminescence from Al/GaN:Mg/GaN LED treated with low-energy electron beam irradiation (LEEBI)", "Institute of Physics: Conference Series", 1990, pp. 725-730, vol. 106, No. 10.
Apr. 14, 2010 Office Action in U.S. Appl. No. 11/264,124.
Apr. 15, 2009 Office Action in U.S. Appl. No. 11/264,124.
Armaroli, N. et al., "Supramolecular Photochemistry and Photophysics.", "J. Am. Chern. Soc.", 1994, pp. 5211-5217, vol. 116.
Aug. 21, 2006 Office Action in U.S. Appl. No. 10/623,198.
Aug. 24, 2007 Office Action in U.S. Appl. No. 11/264,124.
Aug. 26, 2010 Office Action in U.S. Appl. No. 12/131,118.
Berggren, M. et al., "Light-emitting diodes with variable colours from polymer blends", "Nature", Dec. 1, 1994, pp. 444-446, vol. 372.
Berggren, M., et al., "White light from an electroluminescent diode made from poly[3(4-octylphenyl)-2,2'-bithiophene] and an oxadiazole . . . ", "Journal of Applied Physics", Dec. 1994, pp. 7530-7534, vol. 76, No. 11.
Boonkosum, W. et al., "Novel Flat Panel display made of amorphous SiN:H/SiC:H thin film LED", "Physical Concepts and Materials for Novel Optoelectronic Device Applications II", 1993, pp. 40-51, vol. 1985.
Bradfield, P.L., et al., "Electroluminescence from sulfur impurities in a p-n junction formed in epitaxial silicon", "Appl. Phys. Lett", 07110/1989, pp. 10D-102, vol. 55, No. 2.
Chao, Zhang Jin, et al., "White light emitting glasses", "Journal of Solid State Chemistry", 1991, pp. 17-29, vol. 93.
Comrie, M. , "Full Color LED Added to Lumex's Lineup", "EBN", Jun. 19, 1995, p. 28.
CRC Handbook, 63rd Ed., (1983) p. E-201.
Das, N.C., et al., "Luminescence spectra of ann-channel metal-oxide-semiconductor field-effect transistor at breakdown", 1990, pp. 1152-1153, vol. 56, No. 12.
Dec. 16, 2004 Office Action in U.S. Appl. No. 10/623,198.
Dictionary Definition of Phosphor, Oxford English Dictionary Online, Mar. 9, 2012 (Only partial available due to corrupt file as provided on Mar. 22, 2012 in U.S. Appl. No. 12/131,119; Request for Full Reference filed).
El Jouhari, N., et al., "White light generation using fluorescent glasses activated by Ce3+, Tb3+ and Mn2+ ions", "Journal De Physique IV, Colloque C2", Oct. 1992, pp. 257-260, vol. 2.

Feb. 21, 2012 Office Action in U.S. Appl. No. 12/131,118.
Feb. 26, 2008 Office Action in U.S. Appl. No. 11/264,124.
Feb. 4, 2005 Office Action in U.S. Appl. No. 10/623,198.
Feb. 7, 2007 Office Action in U.S. Appl. No. 11/264,124.
Forrest, S. et al. , "Organic emitters promise a new generation of displays", "Laser Focus World ", Feb. 1995, pp. 99-107.
Hamada, Y. et al., "Blue-Light-Emitting Organic Electroluminescent Devices with Oxadiazole Dimer Dyes as an Emitter", "Jpn. J. Appl. Physics", Jun. 1992, pp. 1812-1816, vol. 31.
Hamakawa, Yoshihiro, et al., "Toward a visible light display by amorphous SiC:H alloy system", "Optoelectronics—Devices and Technologies", Dec. 1989, pp. 281-294, vol. 4, No. 2.
Hirano, Masao, et al., "Various performances of fiber-optical temperature sensor utilizing infrared-to-visible conversion phosphor", "Electrochemisty (JP)", Feb. 1987, pp. 158-164, vol. 55, No. 2, Publisher: Electrochemical Society of Japan.
Jang, S., "Effect of Avalanche-Induced Light Emission on the Multiplication Factor in Bipolar Junction Transistors", "Solid-State Electronics", 1991, pp. 1191-1196, vol. 34, No. 11.
Jan. 29, 2007 Office Action in U.S. Appl. No. 10/623,198.
Jan. 30, 2006 Office Action in U.S. Appl. No. 11/264,124.
Jan. 7, 2011 Office Action in U.S. Appl. No. 12/131,119.
Jul. 10, 2008 Office Action in U.S. Appl. No. 11/264,124.
Jul. 14, 2005 Notice of Allowance, Notice of Allowability, and Examiner's Statement of Reasons for Allowance in U.S. Appl. No. 10/623,198.
Jul. 14, 2011 Office Action in U.S. Appl. No. 12/131,119.
Jul. 7, 2011 Office Action in U.S. Appl. No. 12/131,118.
Jun. 14, 2006 Office Action in U.S. Appl. No. 11/264,124.
Jun. 26, 2007 Office Action in U.S. Appl. No. 10/623,198.
Kido, J. et al. , "1,2,4-Triazole Derivative as an Electron Transport Layer in Organic Luminescent Devices", "Jpn. J. Appl. Phys.", Jul. 1, 1993, pp. L917-L920, vol. 32.
Kido, J. et al. , "Bright blue electroluminescence from poly(N-vinylcarbazole)", "Appl. Phys. Letters", Nov. 8, 1993, pp. 2627-2629, vol. 63, No. 19.
Kido, J., et al., "White light-emitting organic electroluminescent devices using the poly(N-vinylcarbazole) emitter layer doped with . . . ", "Appl. Phys. Lett.", Feb. 14, 1994, pp. 815-817, vol. 64, No. 7.
Krames, M., et al., "Status and Future of High-Power Light-Emitting Diodes for Solid-Slate Lighting", "Journal of Display Technology", Jun. 2007, pp. 160-175, vol. 3, No. 2.
Kudryashov, V., et al., "Spectra of Superbright Blue and Green InGaN/AlGaN/GaN Light-Emitting diodes", "Journal of the European Ceramic Society", May 1996, pp. 2033-2037, vol. 17.
Larach, S., et al., "Blue emitting luminescent phosphors: Review and status", "Int'l Workshop on Electroluminescence", 1990, pp. 137-143.
LEDs and Laser Diodes, Electus Distribution, copyright 2001, available at URL:http://www.jaycar.com.au/images_uploaded/ledlaser.Pdf.
Lester, S., et al., "High dislocation densities in high efficiency GaN-based light-emitting diodes", "Appl. Phys. Lett.", Mar. 6, 1995, pp. 1249-1251, vol. 66, No. 10.
Lumogen® F Violet 570 Data Sheet; available at the BASF Chemical Company website Lumogen® F Violet 570 Data Sheet; available at the BASF Chemical Company website URL,http://worldaccount.basf.com/wa/EUen__GB/Catalog/Pigments/doc4/BASF/PRD/30048274/.pdt?title=Technicai%20Datasheet&asset_type=pds/pdf&language=EN&urn=urn: documentum:eCommerce_soi_EU:09007bb280021e27.pdf :09007bb280021e27.pdf.
Mar. 2, 2009 Office Action in U.S. Appl. No. 10/623,198.
Mar. 22, 2012 Office Action in U.S. Appl. No. 12/131,119.
Mar. 28, 2006 Office Action in U.S. Appl. No. 10/623,198.
Mar. 4, 2011 Notice of Allowance, Notice of Allowability, Examiner's Interview Summary, Examiner's Amendment/ Comment and Examiner's Statement of Reason for Allowance in U.S. Appl. No. 11/264,124.
Mar. 7, 2008 Office Action in U.S. Appl. No. 10/623,198.
Maruska, H.P., "Gallium nitride light-emitting diodes (dissertation)", "Dissertation Submitted to Stanford University", Nov. 1973.
Maruska, H.P., et al., "Violet luminescence of Mg-doped GaN", "Appl. Phys. Lett.", Mar. 15, 1973, pp. 303-305, vol. 22, No. 6.

(56) References Cited

OTHER PUBLICATIONS

May 4, 2010 Office Action in U.S. Appl. No. 12/131,119.
McGraw-Hill, "McGraw-Hill Dictionary of Scientific and Technical Terms, Third Edition", "McGraw-Hill Dictionary of Scientific and Technical Terms", 1984, pp. 912 and 1446, Publisher: McGraw-Hill.
McGraw-Hill, "McGraw-Hill Encyclopedia of Science and Technology, Sixth Edition", "McGraw-Hill Encyclopedia of Science and Technology", 1987, pp. 582 and 60-63, vol. 9-10, Publisher: McGraw-Hill.
Mimura, Hidenori, et al., "Visible electroluminescence from uc-SiC/porous Si/c-Si p-n junctions", "Int. J. Optoelectron.", 1994, pp. 211-215, vol. 9, No. 2.
Miura, Noboru, et al., "Several Blue-Emitting Thin-Film Electroluminescent Devices", "Jpn. J. Appl. Phys.", Jan. 15, 1992, pp. L46-L48, vol. 31, No. Part 2, No. 1A IB.
Morkoc et al., "Large-band-gap SIC, 111-V nitride, and II-VI ZnSe-based semiconductor device technologies", J. Appl. Phys. 76(3), 1; Mar. 17, 1994; Illinois University.
Muench, W.V., et al., "Silicon carbide light-emitting diodes with epitaxial junctions", "Solid-State Electronics", Oct. 1976, pp. 871-874, vol. 19, No. 10.
Mukai, T., et al., "Recent progress of nitride-based light emitting devices", "Phys. Stat. Sol.", Sep. 2003, pp. 52-57, vol. 200, No. 1.
Nakamura, S., et al., "High-power InGaN single-quantum-well-structure blue and violet light-emitting diodes", "Appl. Phys. Lett.", Sep. 25, 1995, pp. 1868-1870, vol. 67, No. 13.
Nakamura, S., et al., "The Blue Laser Diode: GaN Based Light Emitters and Lasers", Mar. 21, 1997, p. 239, Publisher: Springer-Verlag.
Nakamura, S., et al., "The Blue Laser Diode: the Complete Story, 2nd Revised and Enlarged Edition", Oct. 2000, pp. 237-240, Publisher: Springer-Verlag.
Nov. 30, 2010 Office Action in U.S. Appl. No. 12/131,118.
Oct. 20, 2008 Office Action in U.S. Appl. No. 10/623,198.
Pankove, J.I., et al., "Scanning electron microscopy studies of GaN", "Journal of Applied Physics", Apr. 1975, pp. 1647-1652, vol. 46, No. 4.
Pavan, P., et al., "Explanation of Current Crowding Phenomena Induced by Impact Ionization in Advanced Si Bipolar Transistors by Means of . . . ", "Microelectronic Engineering", 1992, pp. 699-702, vol. 19.
Pei, Q, et al., "Polymer Light-Emitting Electrochemical Cells", "Science", Aug. 25, 1995, pp. 1086-1088, vol. 269, No. 5227.
Reexam Advisory Action dated Sep. 28, 2012 for U.S. Appl. No. 90/010,940.
Reexam Final Office Action dated May 24, 2012 for U.S. Appl. No. 90/010,940.
Reexam Final Office Action dated Nov. 7, 2011 for U.S. Appl. No. 90/010,940.
Reexam Non-Final Office Action dated Jan. 26, 2012 for U.S. Appl. No. 90/010,940.
Reexam Non-Final Office Action dated Mar. 3, 2011 for U.S. Appl. No. 90/010,940.
Reexam Non-Final Office Action dated Sep. 20, 2010 for U.S. Appl. No. 90/010,940.
Roman. D., "LEDs Turn a Brighter Blue", "Electronic Buyers' News", Jun. 19, 1995, pp. 28 and 35, vol. 960, Publisher: CMP Media LLC.
Saleh and Teich, Fundamentals of Photonics, New York: John Wiley & Sons, 1991, pp. 592-594.
Sato, Yuichi, et al., "Full-color fluorescent display devices using a near-UV light-emitting diode", "Japanese Journal of Applied Physics", Jul. 1996, pp. L838-L839, vol. 35, No. ?A.
Sep. 17, 2009 Notice of Allowance, Notice of Allowability, Examiner's Amendmeni/Comment, and Examiner's Statement of Reasons for Allowance in U.S. Appl. No. 10/623,198.
Sep. 29, 2009 Office Action in U.S. Appl. No. 11/264,124.
Tanaka, Shosaku, et al., "Bright white-light electroluminescence based on nonradiative energy transfer in Ce-and Eu-doped SrS thin films", "Applied Physics Letters", Nov. 23, 1987, pp. 1661-1663, vol. 51, No. 21.
Tanaka, Shosaku, et al., "White Light Emitting Thin-Film Electroluminescent Devices with SrS:Ce,Cl/ZnS:Mn Double Phosphor Layers", "Jpn. J. Appl. Phys.", Mar. 20, 1986, pp. L225-L227, vol. 25, No. 3.
The Penguin Dictionary of Electronics, 3rd edition, pp. 315,437-438, 509-510, copyright 1979, 1988, and 1998.
Ura, M., "Recent trends of development of silicon monocarbide blue-light emission diodes", "Kinzoku", 1989, pp. 11-15, vol. 59, No. 9.
Werner, K., "Higher Visibility for LEDs", "IEEE Spectrum", Jul. 1994, pp. 30-39.
Wojciechowski, J. et al., "Infrared-to-Blue Up-Converting Phosphor", "Electron Technology", 1978, pp. 31-47, vol. 11, No. 3.
Yamaguchi, Y. et al., "High-Brightness SiC Blue LEDS and Their Application to Full Color LED Lamps", "Optoelectronics—Devices and Technologies", Jun. 1992, pp. 57-67, vol. 7, No. 1.
Yang, Y., et al., "Voltage controlled two color light-emitting electrochemical cells", "Appl. Phys. Lett.", 1996, vol. 68, No. 19.
Yoshimi, Masashi, et al., "Amorphous carbon basis blue light electroluminescent device", "Optoelectronics—Devices and Technologies", Jun. 1992, pp. 69-81, vol. 7, No. 1.
Zanoni, E., et al., "Impact ionization, recombination, and visible light emission in ALGaAs/GaAs high electron mobility transistors", "J. Appl. Phys.", 1991, pp. 529-531, vol. 70, No. 1.
Zanoni, E., et al., "Measurements of Avalanche Effects and Light Emission in Advanced Si and SiGe Bipolar Transistors", "Microelectronic Engineering", 1991, pp. 23-26, vol. 15.
Zdanowski, Marek, "Pulse operating up-converting phosphor LED", "Electron Technol.", 1978, pp. 49-61, vol. 11, No. 3.
Zhiming, Chen, et al., "Amorphous thin film white-LED and its light-emitting mechanism", "Conference Record of the 1991 International Display Research Conference", Oct. 1991, pp. 122-125.
Non-Final Office Action dated Feb. 25, 2013 for U.S. Appl. No. 13/204,464.
Final Office Action dated Aug. 27, 2013 for U.S. Appl. No. 13/204,464.
Non-Final Office Action dated Mar. 4, 2014 for U.S. Appl. No. 13/204,464.

\* cited by examiner

HIGH CRI WHITE LIGHT EMITTING DEVICES AND DRIVE CIRCUITRY

CROSS REFERENCE TO RELATED APPLICATION

This application claims the benefit of priority to U.S. Provisional Patent Application No. 61/262,855 entitled "High CRI White Light Emitting Device and Drive Circuitry", filed Nov. 19, 2009 by Wang et al., the specification and drawings of which are incorporated herein by reference.

BACKGROUND OF THE INVENTION

1. Field of the Invention

This invention relates to white light emitting devices with a high (typically ≥80) CRI (Color Rendering Index). More especially the invention concerns white light emitting devices based on solid state light emitting devices, typically LEDs (Light Emitting Diodes), and drive circuitry for operating such devices.

2. Description of the Related Art

White light emitting LEDs ("white LEDs") are known in the art and are a relatively recent innovation. It was not until high brightness LEDs emitting in the blue/ultraviolet (U.V.) part of the electromagnetic spectrum were developed that it became practical to develop white light sources based on LEDs. As taught, for example in U.S. Pat. No. 5,998,925, white LEDs include one or more down converting (i.e. converts photons to photons of a lower energy) phosphor materials, that is photoluminescent materials, which absorb a portion of the radiation emitted by the LED and re-emit radiation of a different color (longer wavelength). Typically, the LED chip generates blue light and the phosphor material(s) absorbs a proportion of the blue light and re-emits light of a different color, typically yellow or a combination of green and yellow light. The portion of the blue light generated by the LED that is not absorbed by the phosphor material combined with the light emitted by the phosphor material provides light which appears to the eye as being nearly white in color.

Due to their long operating life expectancy (of order 30-50,000 hours) and high luminous efficacy (70 lumens per watt and higher) high brightness white LEDs are increasingly being used to replace conventional fluorescent, compact fluorescent and incandescent light sources. Today, most lighting fixture designs utilizing white LEDs comprise systems in which a white LED (more typically an plurality of white LEDs) replaces the conventional light source component. Moreover, due to their compact size, compared with conventional light sources, white LEDs offer the potential to construct novel and compact lighting fixtures.

The ability of a light source to render the color of an object is measured using the Color Rendering Index (CRI) which gives a measure of how a light source makes the color of an object appear to the human eye and how well subtle variations in color shade are revealed. CRI is a relative measurement of the light source's ability to render color compared with a black body radiator. In applications where accurate color rendition is required, such as for example retail lighting, museum lighting and lighting of artwork, a high CRI (typically at least 80) is highly desirable.

A disadvantage of white LEDs can be their relatively low CRI, typically <75, compared with an incandescent source whose CRI>95. The low CRI is due to the absence of light in the red (>600 nm) part of the spectrum. To improve the CRI of a white LED it is known to incorporate a red light emitting phosphor material. However compared with yellow and green down converting phosphor materials, red light emitting phosphor materials have disadvantages. Firstly the energy loss associated with the phosphor material down converting blue light (450 nm, energy 2.76 eV) to red light (630 nm, energy 1.97 eV) is larger than that associated with converting blue light to yellow light (550 nm energy 2.25 eV). This is generally referred to as Stokes loss and the higher Stokes loss associated with red light emitting phosphor materials can reduce the luminous efficacy (lm/watt) of the source. Secondly, since the human eye is less sensitive to red light compared with green or yellow light this requires a larger quantity of red phosphor material to give an equal effect on the eye.

U.S. Pat. No. 6,513,949 and U.S. Pat. No. 6,692,136 teach hybrid white LED lighting systems comprising a combination of one or more LEDs (red or green) and a phosphor-LED consisting of a blue LED and at least one phosphor (green or amber).

U.S. Pat. No. 6,577,073 disclose an LED lamp that includes blue and red LEDs and a phosphor. The blue LED produces an emission falling within a blue wavelength range. The red LED produces an emission falling within a red wavelength range. The phosphor is photo-excited by the emission of the blue LED to exhibit photoluminescence having an emission spectrum in an intermediate wavelength range between the blue and red wavelength ranges.

U.S. Pat. No. 7,213,940 disclose a white light emitting device that comprises first and second groups of solid state light emitters (LEDs) which emit light having a dominant wavelength in a range 430 to 480 nm (blue) and 600 to 630 nm (red) and a phosphor material which emits light with a dominant wavelength in a range 555 to 585 nm (yellow).

Although using a red emitting LED can improve both luminous efficacy and CRI the inventors have appreciated that such a device has limitations. Most notably the Correlated Color Temperature (CCT) and CRI of light generated by such a device can vary significantly with operating temperature. As represented in FIG. 1a the change in emission intensity of blue and red light emitting LEDs with operating temperature is different. Typically the emission intensity of a red LED decreases much more quickly than a blue LED with increased operating temperature. For example over an operating temperature range of 25° C. to 75° C. the emission intensity of a GaN-based blue LED can decrease by about 5% whilst the emission intensity of a AlGaInP-based red LED can decrease by about 40%. In a white light device based on blue and red LEDs these different emission/temperature characteristics will, as shown in FIG. 1b, result in a change in the spectral composition of the emission product and hence an increase in CCT with increased operating temperature. As is known the CCT of a white light source is determined by comparing its hue with a theoretical, heated black-body radiator. CCT is specified in Kelvin (K) and corresponds to the temperature of the black-body radiator which radiates the same hue of white light as the light source. Moreover as shown in FIG. 1b a reduction in the relative proportion of red light in the emission product with increasing operating temperature will result in a decrease in CRI.

A need exists therefore for a high CRI white light emitting device based on solid state light emitters that at least in part overcomes the limitations of existing devices.

SUMMARY OF THE INVENTION

The present invention arose in an endeavor to provide a white light emitting device with a high CRI, typically 80 or higher, that at least in part overcomes the limitations of the known devices.

According to the invention a white light emitting device comprises: at least one blue solid state light emitter operable to generate blue light with a dominant wavelength in a range 400 to 480 nm; at least one phosphor material operable to absorb a portion of the blue light and to emit light with a dominant wavelength in a range 490 to 590 nm; and at least one red solid state light emitter operable to generate red light with a dominant wavelength in a range 600 to 700 nm; wherein the emission product of the device comprises the combined light generated by the blue and red light emitters and light generated by the at least one phosphor material and appears white in color; and a drive circuit operable to compensate for variation in the ratio of red to blue light in the emission product such that over an operating temperature range of at least 25° C. said variation is less than 20%. Ideally the drive circuit is configured to maintain the ratio (relative contribution) of red and blue light in the emission product constant over the operating temperature range. In practice the ratio of red to blue light in the emission product will vary over the operating temperature range and the drive circuit is configured such that said variation is a low as possible preferably less than 10%, more preferably less than 5% and advantageously less than 1%. Ideally the operating temperature range is as large as possible and is at least 20° C., preferably at least 25° C., more preferably at least 50° C., and even more preferably at least 100° C. Advantageously the device is configured such that the emission product has a minimum color rendering index of at least 80, preferably at least 85, more preferably at least 90 and ideally 95 or higher.

The drive circuit is operable to control the power of at least one of the red and blue light emitters in response to a parameter related to the operating temperature of at least one of the blue and red light emitters. Depending on the drive configuration the drive circuit can be operable to control the light emitter's drive current, drive voltage or a combination of both.

In one drive circuit the parameter comprises the temperature of at least one of the blue or red light emitters. In such circuit arrangements the device further comprises a sensor for sensing the temperature of at least the red and/or blue light emitters. In one device the blue and red light emitters are mounted in thermal communication with a thermally conductive substrate and the sensor is configured to sense the temperature of the substrate. In an alternative device, a respective sensor can be provided for sensing the respective temperature of the blue and red light emitters.

The temperature sensor can comprise a temperature dependent resistor (thermistor), a thermocouple or other device having an electrical characteristic that is temperature dependent. In drive circuit configurations where the sensor comprises a temperature dependent resistor at least one of the blue and red light emitters can be connected in series with the temperature dependent resistor and said light emitter operated from a constant voltage source. Since the electrical resistance of a solid state light emitter decreases with increasing temperature such a circuit configuration increases the forward drive current of one or both light emitters in response to an increase in operating temperature. In one arrangement the temperature dependent resistor has a negative temperature coefficient and is connected in series with the at least one red light emitter. Alternatively, the temperature dependent resistor has a positive temperature coefficient and is connected in series with the at least one blue light emitter. In a further arrangement the blue and red light emitters are connected in series with a respective temperature dependent resistor. In such an arrangement the temperature dependant resistor connected to the red light emitter has negative temperature coefficient whilst the temperature dependant resistor connected to the blue light emitter has a positive temperature coefficient. Alternatively, each of the temperature dependent resistors can have a negative temperature coefficient.

In alternative circuit configurations where the sensor comprises a temperature dependent resistor at least one of the blue and red emitters can be connected in parallel with the temperature dependent resistor and said light emitter operated from a constant current source. Such circuit configurations operate as a current divider and alter the forward drive current of one or both light emitters in response to a change in operating temperature. In one arrangement the temperature dependent resistor has a positive temperature coefficient and is connected in parallel with the at least one red light emitter. Alternatively, the temperature dependent resistor has a negative temperature coefficient and is connected in parallel with the at least one blue light emitter. In a further arrangement the blue and red light emitter are connected in parallel with a respective temperature dependent resistor. In one such arrangement the temperature dependant resistor connected in parallel with the red light emitter has positive temperature coefficient whilst the temperature dependant resistor connected in parallel with the blue light emitter has a negative temperature coefficient. Alternatively, each of the temperature dependent resistors can have a positive temperature coefficient.

In yet a further circuit configuration the blue and red light emitters are connected in parallel and driven from a constant current source and the temperature dependent resistor has a negative temperature coefficient and is connected in series with the at least one red light emitter and configured such that in operation the drive current of the at least one red light emitter increases relative to the drive current of the at least one blue light emitter with increasing temperature. Alternatively the blue and red light emitters are connected in parallel and driven from a constant current source and the temperature dependent resistor has a positive temperature coefficient and is connected in series with the at least one blue light emitter and configured such that in operation the drive current of the at least one blue light emitter decreases relative to the drive current of the at least one red light emitter with increasing temperature. In yet a further configuration the blue and red light emitters are connected in parallel and driven from a constant current source and a respective temperature dependent resistor is connected in series with the blue and red light emitters.

In circuit configurations that use a temperature dependent resistor to control the drive power of the red and/or blue light emitters the resistance and temperature coefficient are selected such the temperature dependent resistor has a resistance/temperature characteristic that is related to the emission intensity/temperature characteristic of at least one of the blue and red light emitters. In configurations where the power of only one light emitter is controllable the resistance and temperature coefficient are preferably selected such the temperature dependent resistor has a resistance/temperature characteristic that is related to the difference in emission intensity/temperature characteristic of the blue and red light emitters. In configurations where the power of both light emitters is controllable the resistance and temperature coefficient are selected such the temperature dependent resistor has a resistance/temperature characteristic that is related to the emission intensity/temperature characteristic of a respective light emitter.

In further devices the drive circuit is operable to compare the measured temperature with a reference temperature and in dependence on the difference in temperature, to control the drive current or drive voltage of one or both light emitters to maintain the relative contributions of red and blue light in the emission product substantially constant. Preferably the drive circuit is operable to control the drive current of the red light emitter(s). Alternatively, the drive circuit is operable to control the drive current of the blue light emitter(s). Conveniently, the drive circuit comprises a voltage comparator operable to compare voltages corresponding to the measured and reference temperatures.

As is known LEDs are often operated using a constant current source and the inventors have appreciated that a parameter that is related to the operating temperature of the light emitter is the LEDs' forward drive voltage. Accordingly in one arrangement the drive circuit is operable to control the drive current in dependence on the forward drive voltage of at least one of the blue and red light emitters. A benefit of using the forward drive voltage to control the drive current is that it eliminates the need for a temperature sensor enabling the drive circuit to be located remotely to the device. In a preferred configuration the drive circuit is operable to control the drive current in dependence on the difference between the forward drive voltages of the blue and red light emitters. Such a configuration can be implemented using a voltage comparator to compare the forward drive voltages of the blue and red emitters and to control the current of a controllable current source driving the blue and/or red light emitters.

BRIEF DESCRIPTION OF THE DRAWINGS

In order that the present invention is better understood high CRI white light emitting devices and drive circuitry in accordance with the invention will now be described, by way of example only, with reference to the accompanying drawings in which:

FIG. 5b is a plot of percentage change of forward drive current ($\Delta i_F/i_F$) versus temperature dependent resistor resistance ($R_T$) for drive currents of 40 mA, 160 mA, 350 mA, 400 mA for the circuit of FIG. 5a;

FIG. 5c is a plot of percentage change of forward drive current $\Delta i_F/i_F$ versus proportion of power dissipated by the temperature dependent resistor for drive currents of 40 mA, 160 mA, 350 mA, 400 mA for the circuit of FIG. 5a;

FIG. 5d is a plot of the proportion of power dissipated by the temperature dependent resistor versus temperature dependent resistor resistance $R_T$ for drive currents of 40 mA, 160 mA, 350 mA, 400 mA for the circuit of FIG. 5a;

DETAILED DESCRIPTION OF THE INVENTION

Figure 1A:
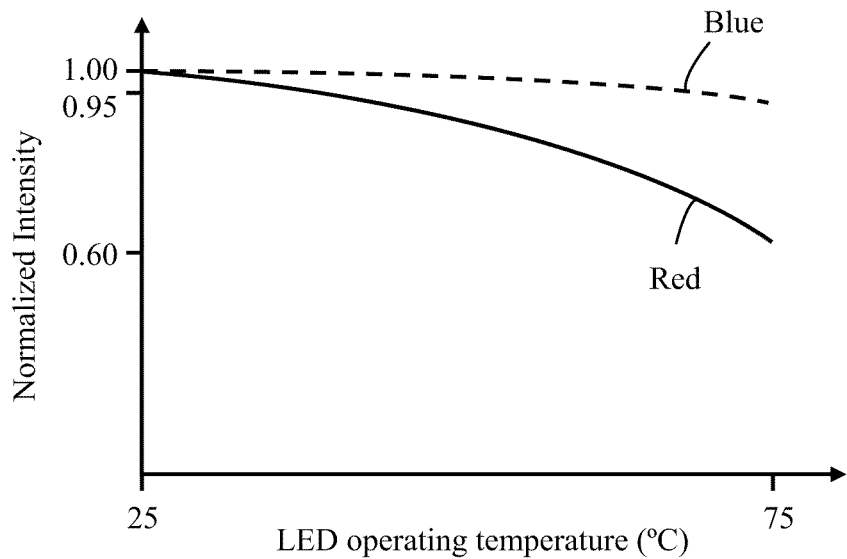
FIG. 1a is a plot of emitted light intensity versus operating temperature for blue and red light emitting LEDs as previously described.
Figure 1B:
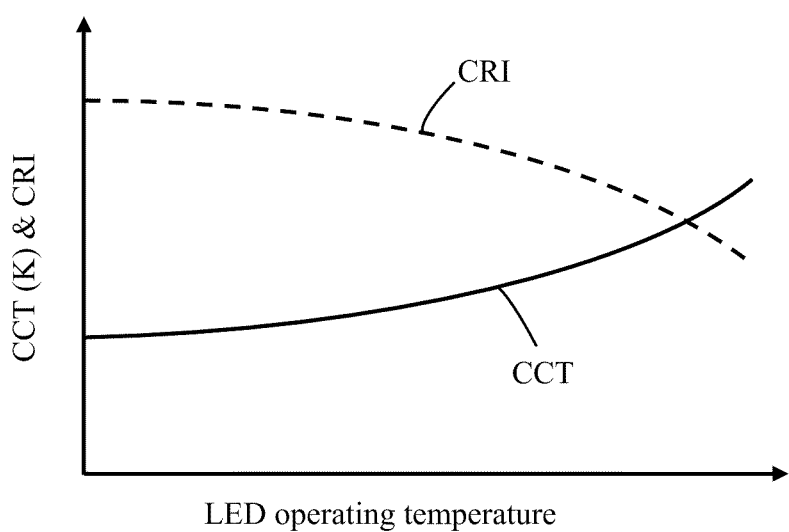
FIG. 1b is a plot of CCT and CRI of emitted light versus operating temperature for a known white light emitting device comprising blue and red LEDs as previously described.

Embodiments of the invention are directed to white light emitting devices comprising at least one blue solid state light emitting device that is operable to generate blue light with a dominant wavelength in a range 400 nm to 480 nm (blue); at least one phosphor material operable to absorb a portion of the blue light emitted by the blue light emitter(s) and to emit light with a dominant wavelength in a range 490 nm to 590 nm (bluish green to orange yellow); and at least one red solid state light emitter that is operable to generate red light with a dominant wavelength in a range 600 nm to 700 nm (red). The emission product of the device, which appears white in color, comprises the combined light generated by the blue and red light emitters and the light generated by the phosphor material. Typically the device is configured to have a CRI of at least 80. The device further comprises drive circuitry that is operable to control the power (forward drive current, forward drive voltage or a combination of both) of the red and/or blue light emitters in response to a parameter that is related to the operating temperature of the blue and/or red light emitters such as to maintain the relative contributions (ratio) of red and blue light in the emission product substantially constant. Such a device can produce an emission product whose CRI and CCT are substantially constant. Typically the variation in CRI and/or CCT is less than 10%. The parameter used to control the drive power of the light emitter(s) can comprise an operating temperature of the light emitter(s). In other arrangements where the light emitters are driven in a constant current configuration the parameter can comprise the forward drive voltage which is related to the light emitter's operating temperature. Typically the drive circuitry can be incorporated in the device packaging or provided separately to the device, for example, as a part of power supply used to operate the device.

Light Emitting Devices

Examples of light emitting devices in accordance with the invention will now be described with reference to FIGS. 2a to 2e, 3a, 3b, 4a and 4b of the accompanying drawings. Throughout this specification like reference numerals preceded by the figure number are used to denote like parts.

A white light emitting device 200 in accordance with an embodiment of the invention is now described with reference to FIGS. 2a and 2b which respectively show a schematic plan view of the device and a sectional view through A-A. The device 200 is configured to generate white light with a Correlated Color Temperature (CCT) of ≈2700K, a minimum emission luminous flux of ≈750 lumens (lm), a minimum luminous efficacy of 100 lm/W and a minimum CRI of 80.

The device 200 comprises a package 202 (FIG. 2b) such as for example is described in co-pending U.S. patent application Ser. No. 12/781,194 filed May 16, 2010 entitled "Light Emitting Device" (Hwa S U et al.) the entire content of which is incorporated herein by way of reference thereto. The package 202 comprises a layered structure comprising in order a 1 cm square copper (Cu) substrate 204, a circuit layer 206 and a square ceramic ($Al_2O_3$) top 208. The ceramic top 208 includes a circular through hole such that when the top 208 is mounted to the copper substrate 204 it defines a shallow circular recess 210. A blue (dominant wavelength in a range 450 nm-480 nm, typically about 465 nm) light emitting LED chip 212 is mounted on the center of the floor of the recess 210 in direct thermal communication with the copper substrate 204. The blue LED chip 212 can comprise, for example, a GaN (gallium nitride) based monolithic LED chip array such as an MC (multi chip) chip manufactured by Epistar Corporation® of Taiwan. Such an LED multi chip typically has a dominant emission wavelength of 450 nm, 460 nm or 470 nm and a radiant flux of 1500 mW to 2000 mW.

The device further comprises two red (600 nm-700 nm) light emitting LED chips 214 mounted adjacent the blue LED chip 212 on the floor of the recess 210 in direct thermal communication with the copper substrate 204. The red LED chips 214 can comprise, for example, an AlGaInP (aluminum gallium indium phosphide) based LED chips such as Epistar Corporation's® ES-LASOPH42 chip. Such LED chips typically have a dominant emission wavelength of 615 nm and an emission luminous flux of 35 lm to 45 lm.

The LED chips 212, 214 are electrically connected to the circuit layer 206 by bond wires 216. The circuit layer 206 can comprise an arrangement of thin copper tracks on one or more thin electrically insulating layer(s) 207 and is configured to interconnect the LEDs in a desired circuit configuration.

The device 200 further comprises a dome-shaped (generally hemispherical) lens 218 which has a uniform thickness layer of phosphor material 220 on its planar base. The phosphor or photoluminescent material 220 is operable to absorb at least a portion of the blue light emitted by the LED chip 212 and to emit light with a dominant wavelength in a range 490 nm to 590 nm (bluish green to orange yellow).

The devices of the invention are particularly suited to use with inorganic phosphor materials such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in U.S. Pat. No. 7,575,697 "Europium activated silicate-based green phosphor" (assigned to Intematix Corp.), U.S. Pat. No. 7,601,276 "Two phase silicate-based yellow phosphor" (assigned to Intematix Corp.), U.S. Pat. No. 7,655,156 "Silicate-based orange phosphor" (assigned to Intematix Corp.) and U.S. Pat. No. 7,311,858 "Silicate-based yellow-green phosphor" (assigned to Intematix Corp.) the specification and drawings of each of which is incorporated herein by reference. The phosphor can also comprise an aluminate-based material such as is taught in our co-pending patent application US2006/0158090 "Aluminate-based green phosphor", an aluminum-silicate phosphor as taught in co-pending application US2008/0111472 "Aluminum-silicate orange-red phosphor" or a nitride-based red phosphor material such as is taught in our co-pending U.S. patent application Ser. No. 12/632,550 filed Dec. 7, 2009. It will be appreciated that the phosphor material is not limited to the examples described herein and can comprise any phosphor material including nitride and/or sulfate phosphor materials, oxy-nitrides and oxy-sulfate phosphors or garnet materials (YAG).

The phosphor material 220, which is in powder form, is thoroughly mixed in known proportions with a liquid binder material to form a suspension and the resulting phosphor composition deposited onto the surface of the lens 218 using for example spin coating, screen printing, inkjet, letterpress, gravure or flexograph printing. The liquid binder material can comprise a U.V. or thermally curable liquid polymer such as a U.V. curable acrylic adhesive or silicone.

In operation light emitted by the device 200, which appears white in color, comprises the combined light emitted by the blue LED chip 212, red LED chips 214 and green/yellow light generated by the phosphor material 220.

Figure 2A:
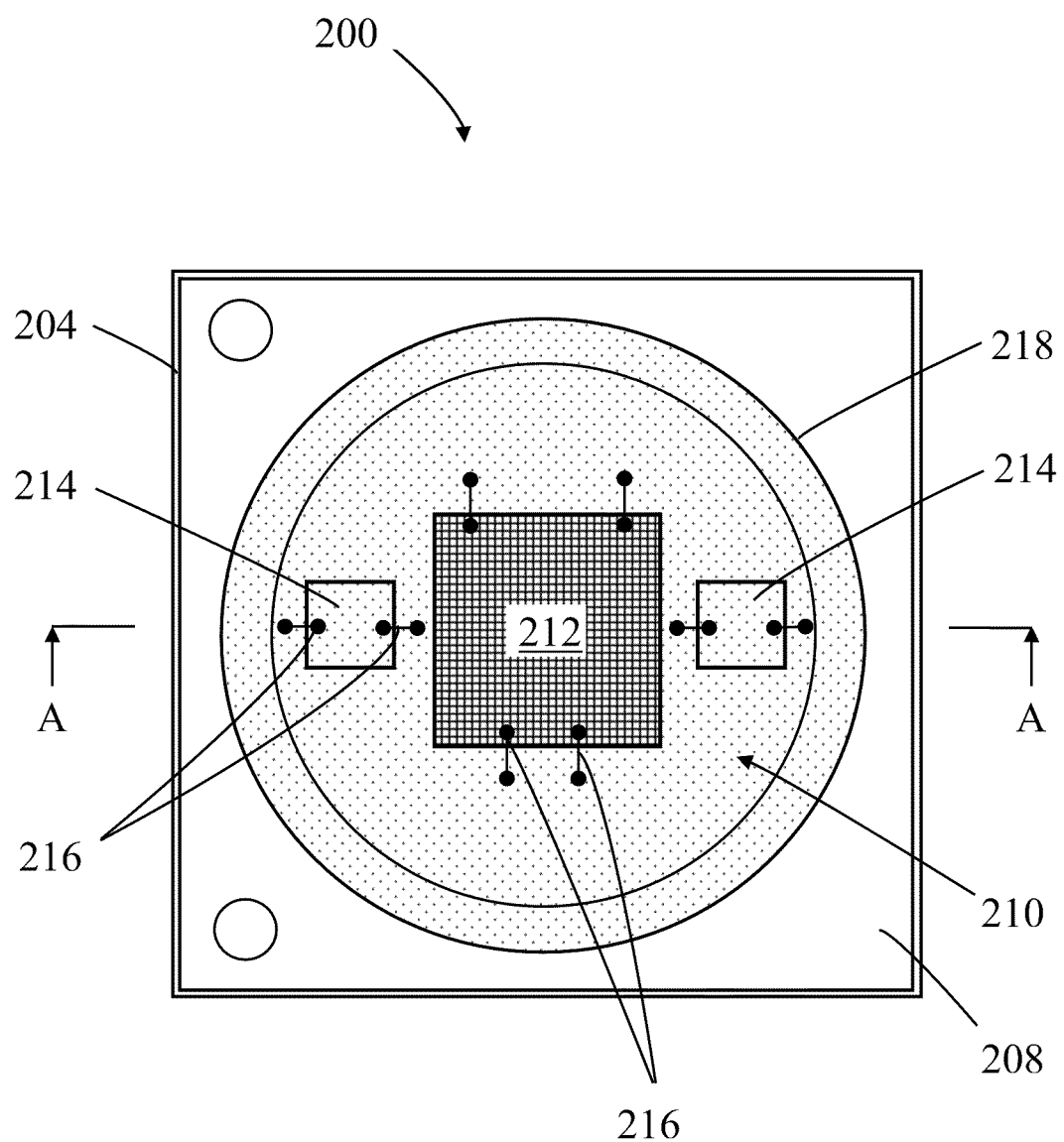
FIG. 2a is a plan view of a white light emitting device in accordance with an embodiment of the invention.
Figure 2B:
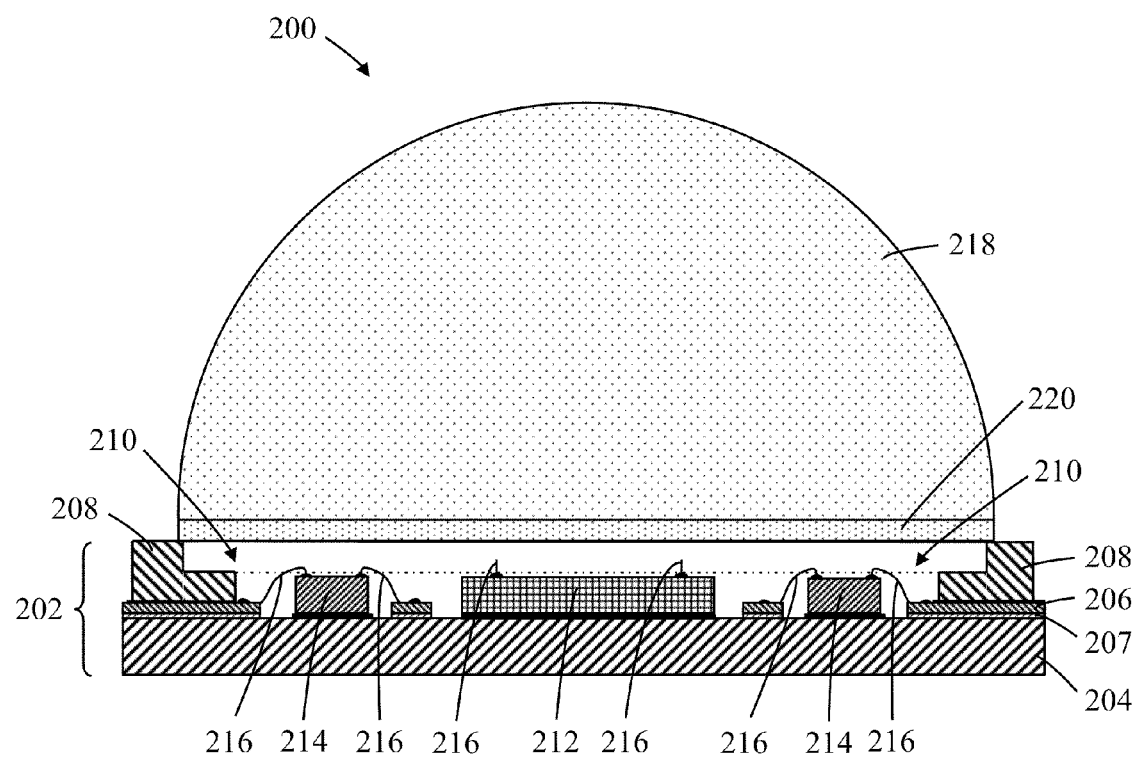
FIG. 2b is a sectional view of the device of FIG. 2a through A-A.
Figure 2C:
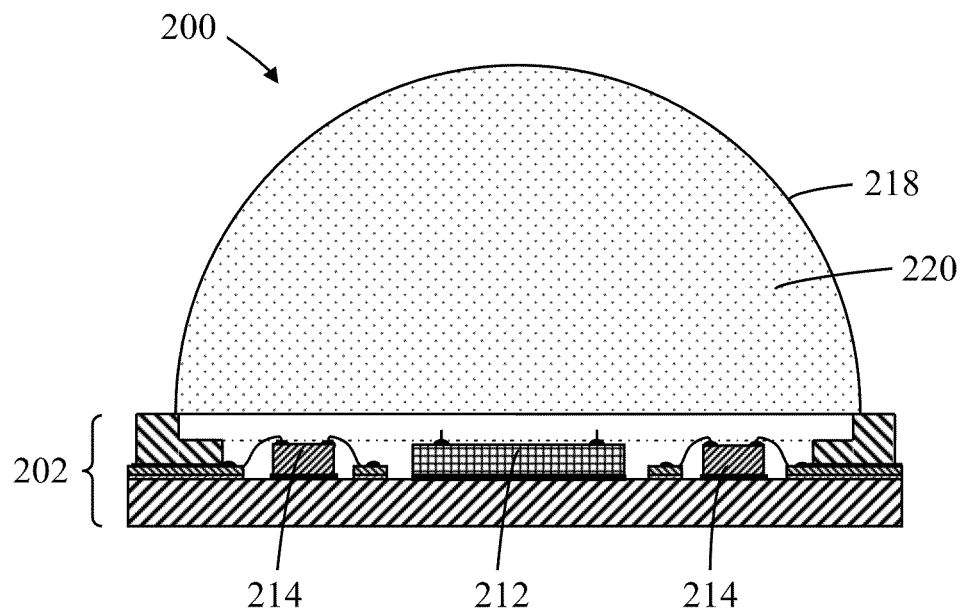
FIG. 2c is a sectional view of the device of FIG. 2a through A-A showing an alternative phosphor configuration.

Alternatively as shown in FIG. 2c the phosphor material 220 can be incorporated in the lens 218 which is fabricated from a light transmissive polymer material such as an optical grade silicone, acrylic, polycarbonate, poly(methyl methacrylate) (PMMA). In the finished lens 218 the phosphor material is homogeneously distributed throughout the volume of the lens.

Figure 2D:
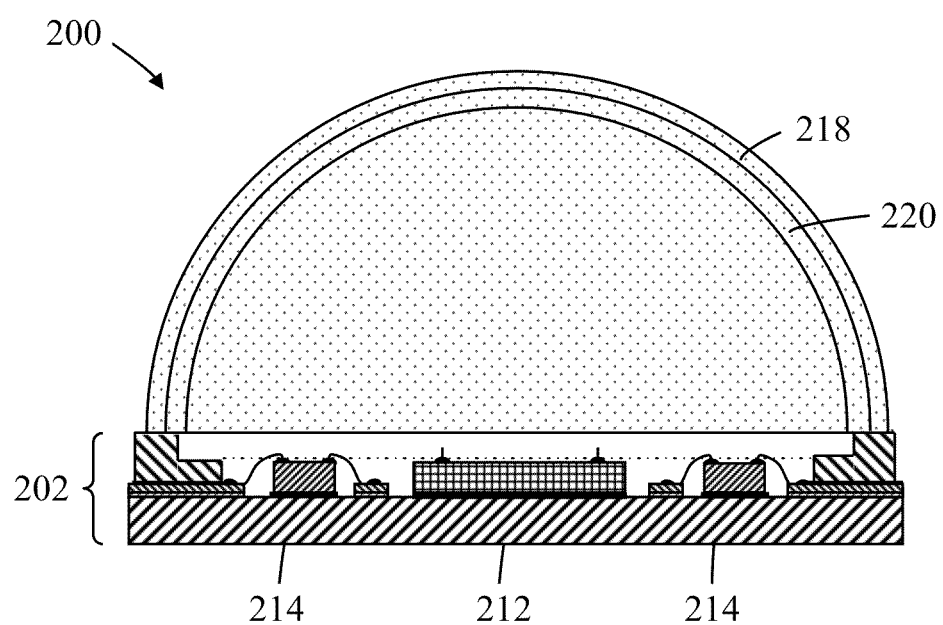
FIG. 2d is a sectional view of the device of FIG. 2a through A-A showing another alternative phosphor configuration.

In another arrangement the lens 218 can comprise a dome-shaped (generally hemispherical) shell and the phosphor material phosphor material 220 can be deposited as one or more uniform thickness layers on the inner curved surface of the lens (FIG. 2d).

Figure 2E:
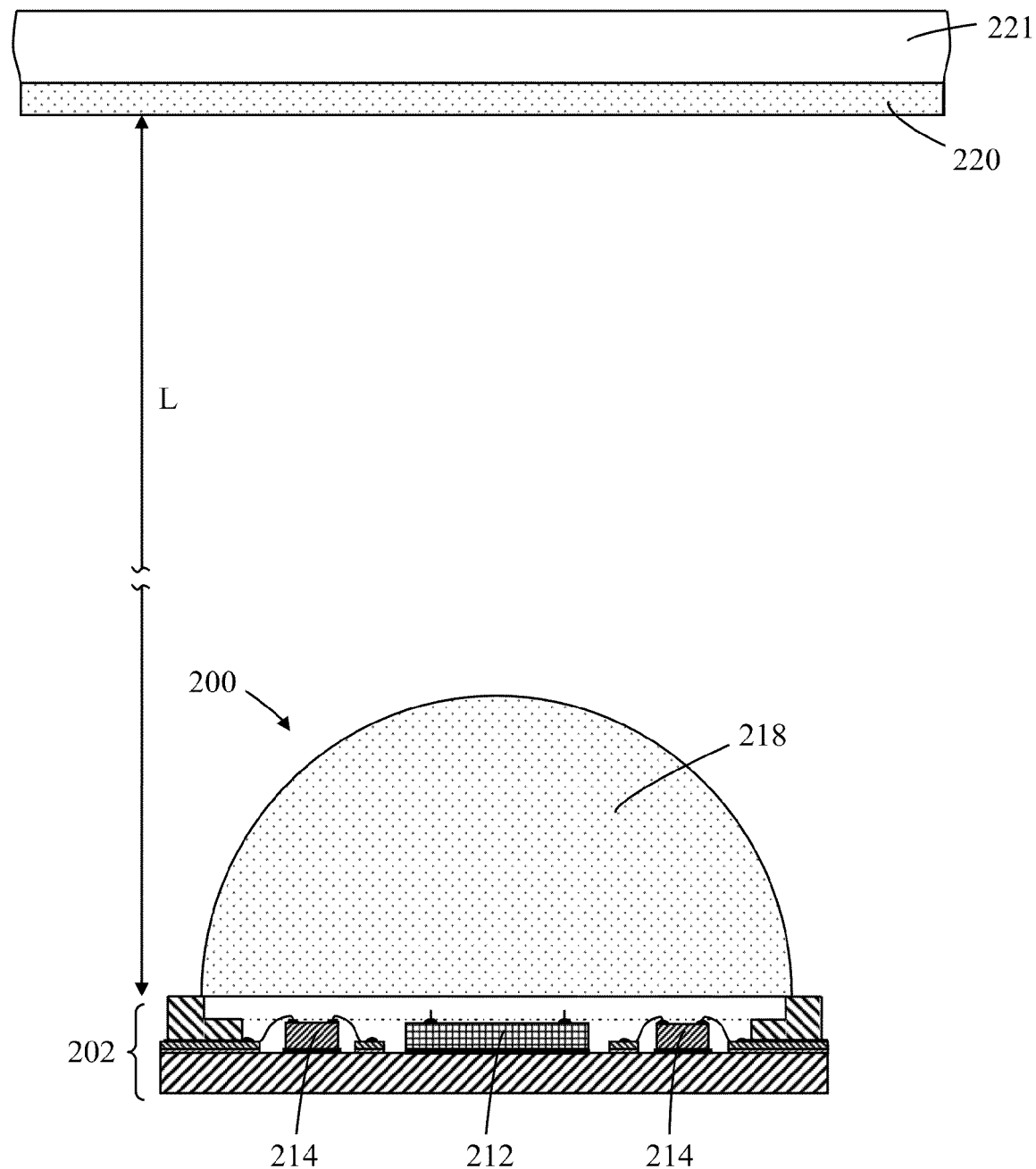
FIG. 2e is a sectional view of the device of FIG. 2a through A-A with a remote phosphor configuration.

As illustrated in FIG. 2e and to reduce the transfer of heat generated by the LEDs to the phosphor material, it is further envisioned to provide the phosphor material remote to the device 200 in the form of an optical component such as, for example, a light transmissive window 221 that includes one or more layers of phosphor material 220. Alternatively the phosphor material can be incorporated in the light transmissive window 221. The window 221 including the phosphor material 220 is physically separated from the device 200, by an air gap of length L that is typically at least 5 mm to provide adequate thermal isolation of the phosphor material. Locating the window remote to the device provides a number of benefits namely reduced thermal degradation of the phosphor material. Additionally compared with devices in which the phosphor material is provided in close or direct contact with the light emitting surface of the LEDs, providing the phosphor material remote to the device reduces absorption of backscattered light by the device. Furthermore locating the phosphor material remotely enables generation of light of a more consistent color and/or CCT since the phosphor material is provided over a much greater area as compared to providing the phosphor directly to the light emitting surface of the LED chip(s). The window 221 is fabricated from a light transmissive polymer material such as an optical grade silicone, acrylic, polycarbonate, poly(methyl methacrylate) (PMMA) or a glass such as fused silica or a borosilicate glass such as Pyrex® (Pyrex® is a brand name of Corning Inc). Typically the window 221 and device 200 can be incorporated in a lighting fixture or lighting module.

Figure 3A:
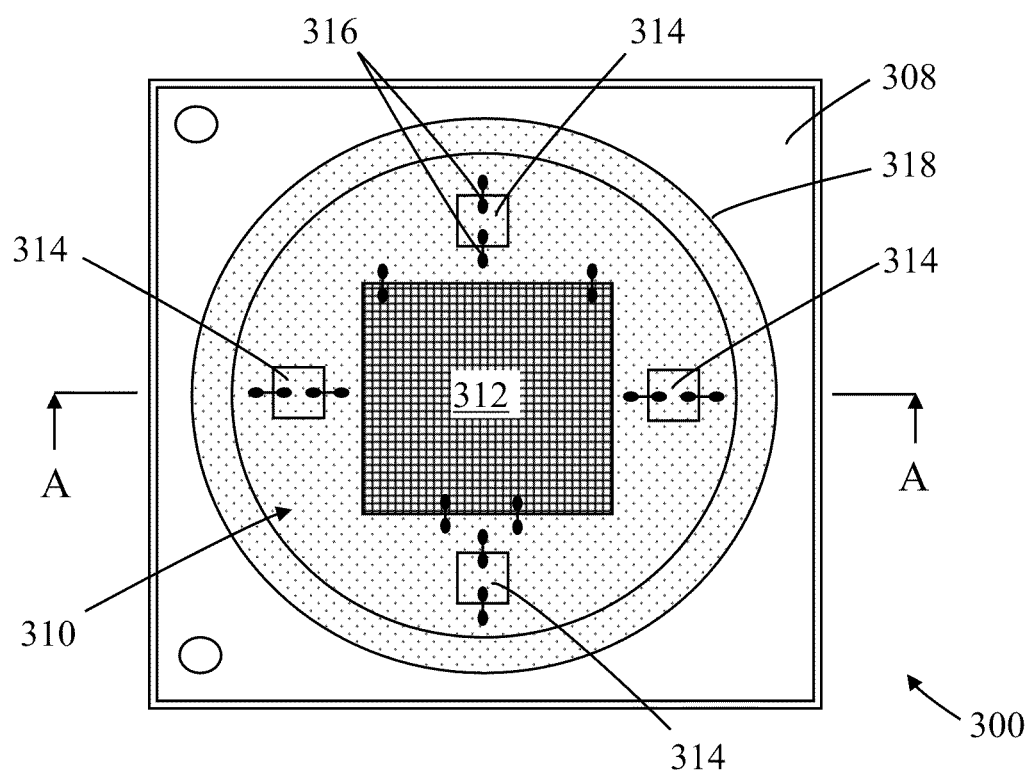
FIG. 3a is a plan view of a white light emitting device in accordance with another embodiment of the invention.
Figure 3B:
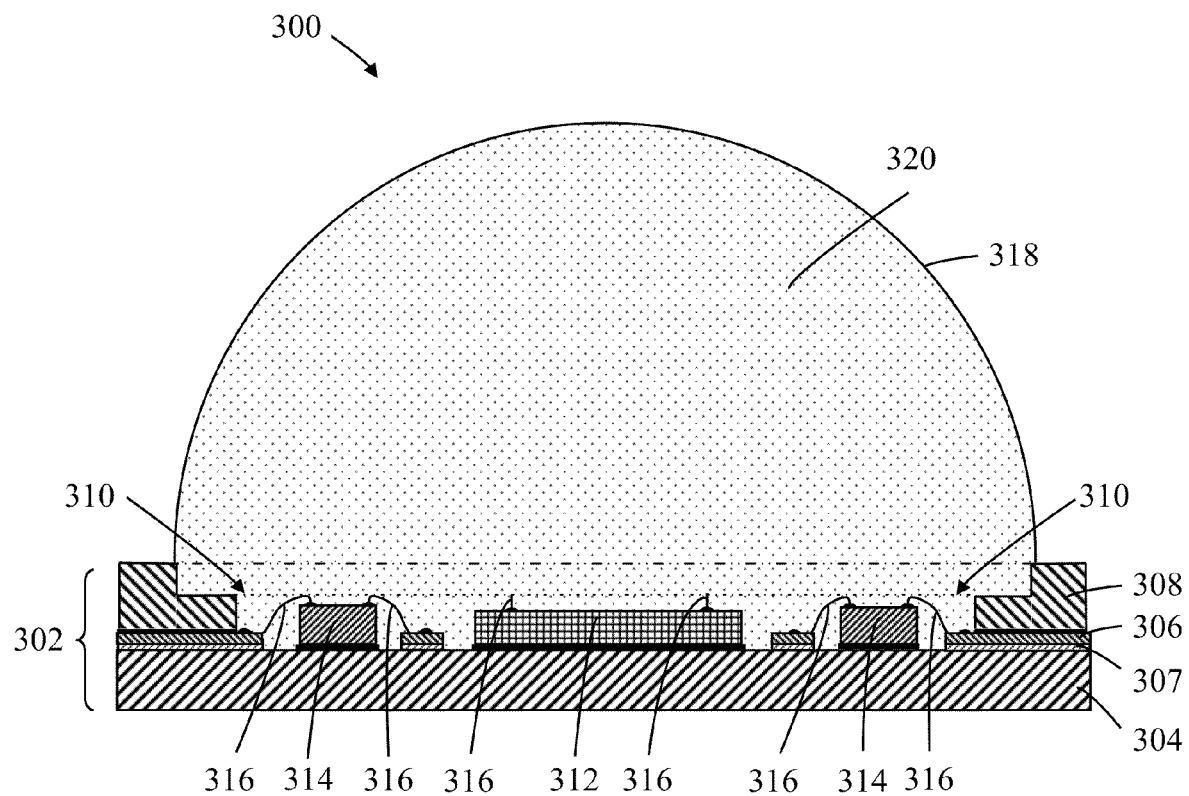
FIG. 3b is a sectional view of the device of FIG. 3a through A-A.

A white light emitting device 300 in accordance with another embodiment of the invention is now described with reference to FIGS. 3a and 3b which respectively show a schematic plan view of the device and a sectional view through a line A-A. The device 300 is configured to generate white light with a Correlated Color Temperature (CCT) of ≈2700K, a minimum emission luminous flux of ≈750 lm, a minimum luminous efficacy of 100 lm/W and a minimum CRI of 80.

The device 300 is virtually identical to the arrangement of FIGS. 2a and 2b except that it contains four lower power red (600 nm-700 nm) light emitting LED chips 314. The LED chips 314 are mounted around the blue LED chip array 312 on the floor of the recess 310 in direct thermal communication with the copper substrate 304. In this embodiment the red LED chips 314 can comprise, for example, an AlGaInP (aluminum gallium indium phosphide) based LED chips such as Epistar Corporation's® ES-LASOPH28 chip. Such LED chips typically have a dominant emission wavelength of 615 nm and an emission luminous flux of 25 to 30 lm. In the embodiment illustrated the lens 318 is formed (molded) in situ on the package 302 by filling the recess 310 with the phosphor/polymer mixture.

Figure 4A:
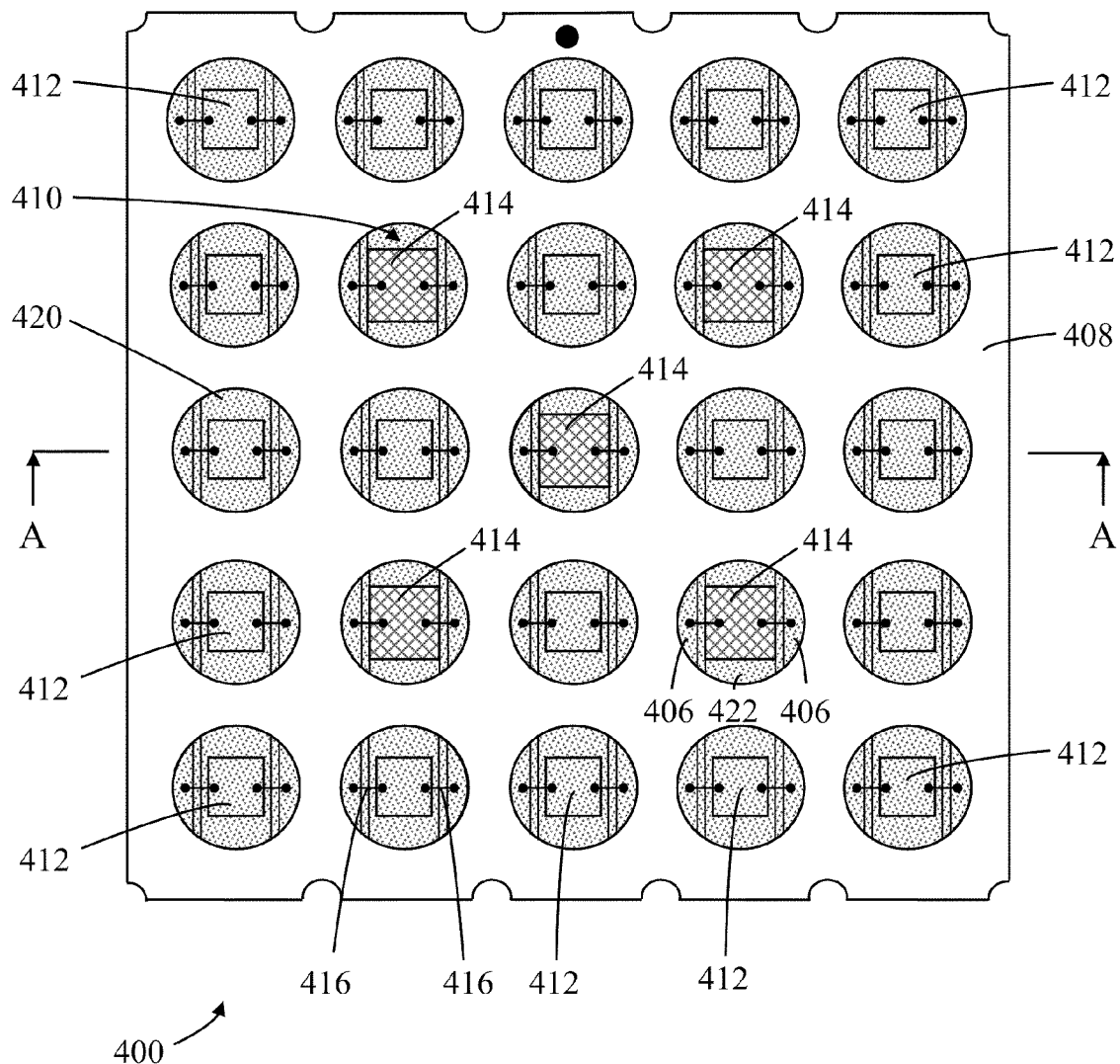
FIG. 4a is a plan view of a white light emitting device in accordance with a further embodiment of the invention.
Figure 4B:
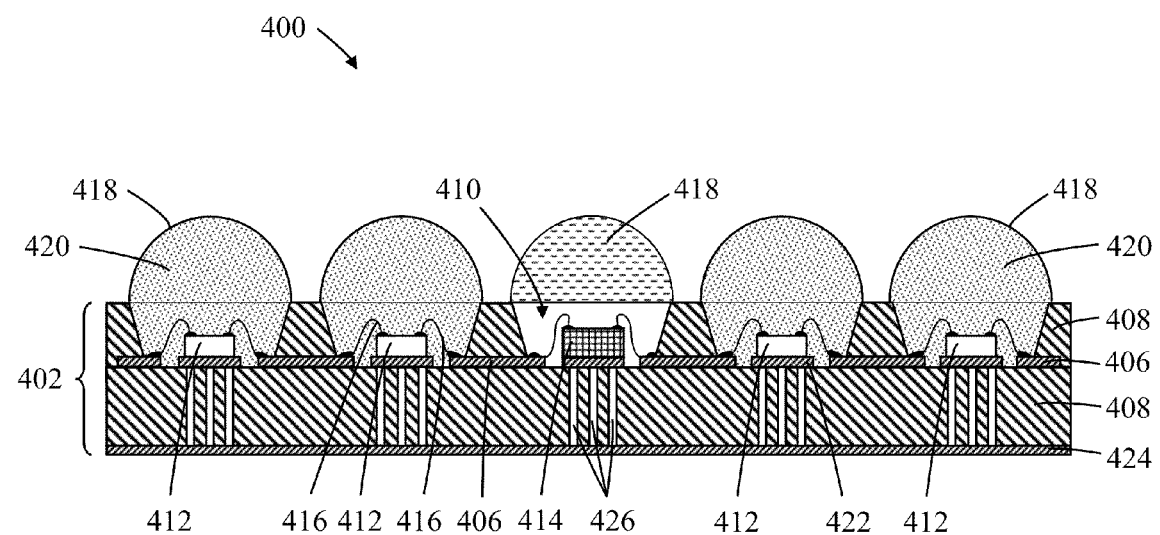
FIG. 4b is a sectional view of the device of FIG. 4a through A-A.

A white light emitting device 400 in accordance with a third embodiment of the invention is now described with reference to FIGS. 4a and 4b which respectively show a schematic plan view of the device and a sectional view through a line A-A. The device 400 is configured to generate white light with a Correlated Color Temperature (CCT) of ≈2700K, a minimum emission luminous flux of ≈750 lm, a minimum luminous efficacy of 100 lm/W and a minimum CRI of 80.

The device 400 comprises an LTCC (low temperature co-fired ceramic) package 402 for example as described in co-pending United States patent application Publication No. US 2009/0294780 (filed May 27, 2008) the entire content of which is incorporated herein by way of reference thereto. In the embodiment shown the package 402 is a square multilayered ceramic package having a square array of twenty five (five rows by five columns) circular recesses 410. Each recess 410 is configured to house a respective LED chip.

The package 402 comprises a 14 mm square ceramic body 408 containing one or more circuit layers 406 composed of silver (Ag). On the floor of each recess 410 there is provided a silver mounting pad 422. As illustrated the lower face of the package can include a thermally conductive base 424. Typically the mounting pads 422 are connected in thermal communication with the base by thermally conductive vias 426. Twenty blue (450 nm-480 nm) light emitting LED chips 412 are mounted on the floor of a respective recess 410 in direct thermal communication with the silver mounting pad 422. The blue LEDs 412 can comprise, for example, InGaN (indium gallium nitride) based chips such as Epistar Corporation's® ES-CABLV24B H9 chip. Such an LED multi chip typically has a dominant emission wavelength of 450 nm, 460 nm or 470 nm and a radiant flux of 95 mW to 110 mW.

The device further comprises five red (600 nm-700 nm) light emitting LED chips 414 mounted within a respective recess 410 in direct thermal communication with the silver mounting pad 422. The red LEDs 414 can comprise, for example, an AlGaInP (aluminum gallium indium phosphide) based LED chip such as Epistar Corporation's® ES-LASOPH24. Such LED chips typically have a dominant emission wavelength of 615 nm and an emission luminous flux of 10 lm to 17 lm. As shown the five red LED chips 414 are located within the recesses 410 located at the center position of the array and each of the four corners of the square (three rows by three columns) surrounding the center recess.

The LED chips 412, 414 are electrically connected by the circuit layer 406.

Drive Circuits

Figure 5A:
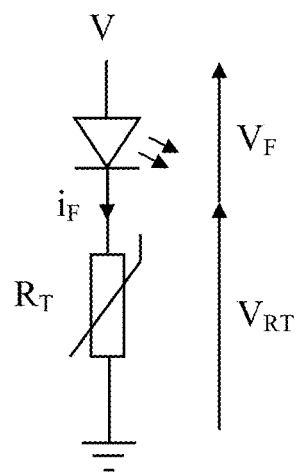
FIG. 5a is a circuit diagram of an LED connected in series with a temperature dependent resistor.
Figure 5B:
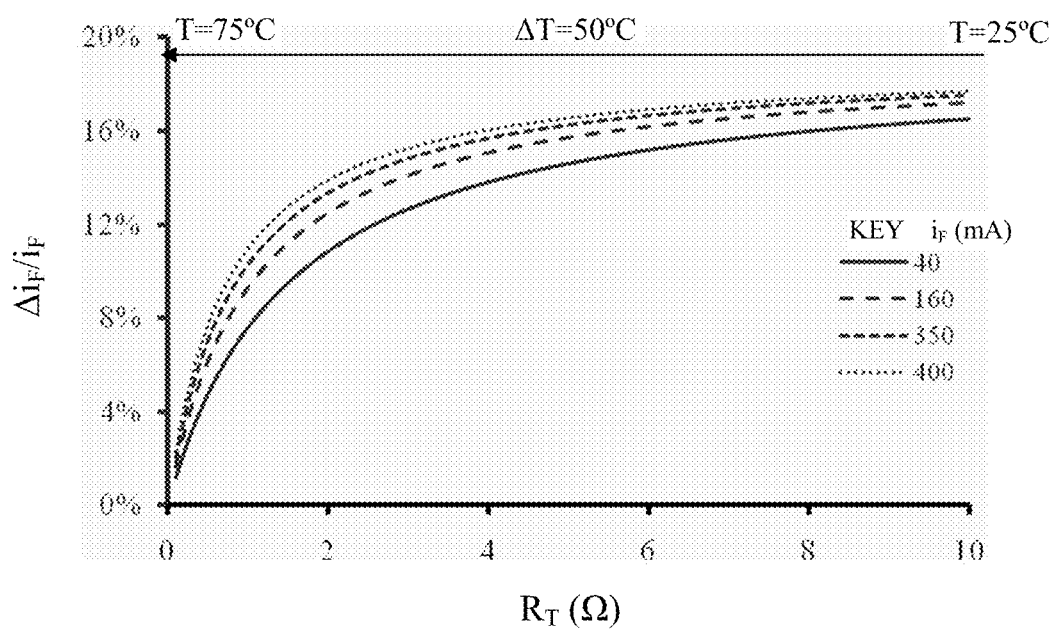

Exemplary drive circuits for operating the device of the invention are now described with reference to FIGS. 5a to 5y. Each of the drive circuits is operable to control the drive power of at least one of the red and/or blue LED chips in response to a parameter that is related to the operating temperature T of at least one of the red and/or blue LED chips such as to minimize variation in the ratio of red to blue light in the emission product of the device over the operating temperature range of the device. Depending on its complexity the drive circuit can be housed within the device package or as incorporated as part of the power supply used to operate the device.

As will be described depending on the drive configuration of the LED chips the drive power can be controlled by controlling the forward drive current $i_F$, forward drive voltage $V_F$ or a combination of both of the red and/or blue LED chips. Initial tests indicate that by appropriate circuit configuration the light emitting device of the invention can produce an emission product in which the CRI and CCT have a variation of less than 10% or even less than 5% for a change in operating temperature of 50° C. ($\Delta T=50°$ C.). In the embodiments described the parameter used to control the LED chip drive current can comprise the operating temperature of the red and/or blue LED chips or the forward drive voltage $V_F$ of the LED chip(s) which is related to the LED chip operating temperature.

As is known LEDs can be driven in a constant voltage or constant current configurations. Firstly drive circuits that are essentially constant voltage configurations are described.

Constant Voltage Drive Circuits

In drive circuits in which the LED chips are driven by a constant drive voltage V the forward drive current $i_F$ and/or drive voltage $V_F$ of the LED can be controlled to minimize the variation in the ratio of red to blue light in the emission product of the device over the device's operating temperature range. In such circuit configurations the temperature of one or both LED chips can be used to control the forward drive current and/or voltage of the LED chips and the temperature is conveniently sensed using a temperature dependent resistor (thermistor). FIG. 5a shows an LED connected in series with a temperature dependent resistor $R_T$ that is driven from a constant voltage source V. For such a circuit the forward drive voltage $V_F$ of the LED is given by the relationship:

$$V_F = V - V_{RT} = V - i_F R_T$$

where V is the constant drive voltage, $V_{RT}$ is the voltage drop across the temperature dependent resistor and $R_T$ is the resistance of the temperature dependent resistor. As is known the resistance of a temperature dependent resistor is given by:

$$R_T = R_0(1 + K(T - T_0))$$

where T is the temperature and K the temperature coefficient of the temperature dependent resistor. The effective resistance of an LED ($V_F/i_F$) is a non-linear function of temperature and decreases with increasing temperature. As a result for an LED connected in series with a temperature dependent resistor with a negative temperature coefficient (NTC, i.e. electrical resistance decreases with increasing temperature) the total resistance ($R_T + V_F/i_F$) will decrease with increasing temperature. Since the LED is driven from a constant voltage source V the forward drive current $i_F$ will increase with increasing temperature. For such a circuit arrangement the forward drive current $i_F$ and forward drive voltage $V_F$ of the LED will change with temperature according to the relationship:

$$\frac{1}{i_F}\frac{di_F}{dT} = -\frac{KR_0 + \frac{1}{i_F}\frac{\partial V_F}{\partial T}}{R_T + \frac{\partial V_F}{\partial i_F}}$$

-continued where $\frac{\partial v_F}{\partial T}$ is the change of forward drive voltage with temperature and $\frac{\partial v_F}{\partial i_F}$ is the change of LED forward drive voltage with forward drive current. Values for $\partial v_F/\partial T$ and $\partial v_F/\partial i_F$ can be empirically determined from the measured forward drive voltage $V_F$ versus temperature T and the forward drive voltage $V_F$ versus forward drive current $i_F$ characteristics of an LED driven from a constant voltage source (i.e. without the thermistor). As a result, the change in forward drive current $i_F$ at different temperatures can be calculated. FIG. 5b are plots of the percentage change of forward drive current ($\Delta i_F/i_F$) versus thermistor resistance $R_T$ over an operating temperature range 25° C. to 75° C. ($\Delta T=50°$ C.) for drive currents $i_F$ of 40 mA, 160 mA, 350 mA and 400 mA. In FIG. 5b the LED is an Epistar Corporation® ES-LASOPH42 red LED chip which has standard current rating of 350 mA and the thermistor has a resistance of 10Ω at 25° C. and a NTC (negative temperature coefficient) K=−0.0038/° C. As can be seen from FIG. 5b the percentage change of forward drive current $\Delta i_F/i_F$ over a 50° C. temperature variation ($\Delta T=50°$ C.) is a function of the thermistor resistance $R_T$ and the forward current of the LED. For a thermistor with of resistance $R_T \geq 10\Omega$ a change of current (adjustment) of ≈16% can be achieved over a temperature variation $\Delta T=50°$ C.

Figure 5C:
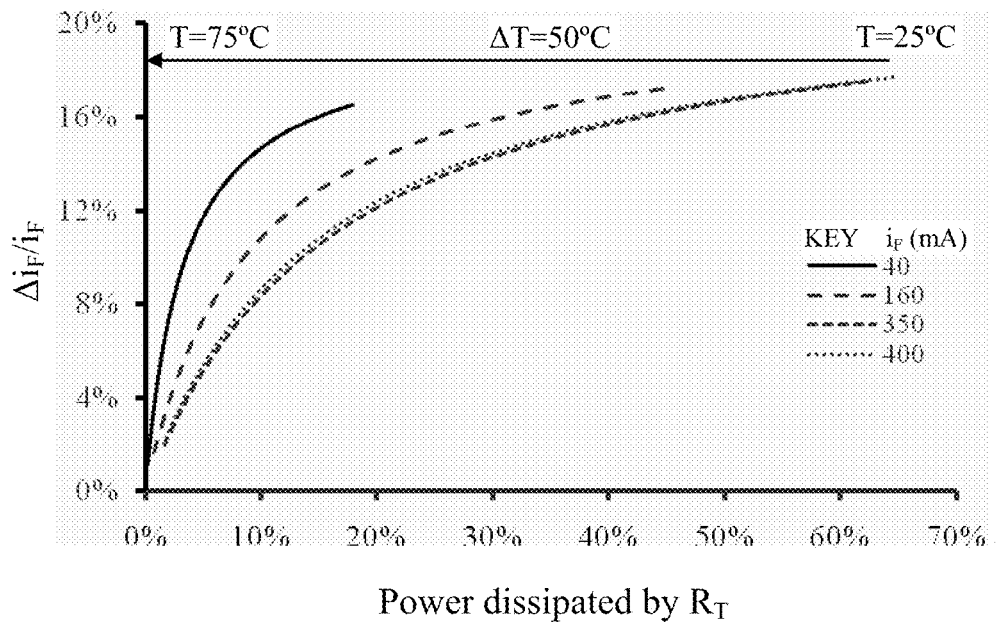
Figure 5D:
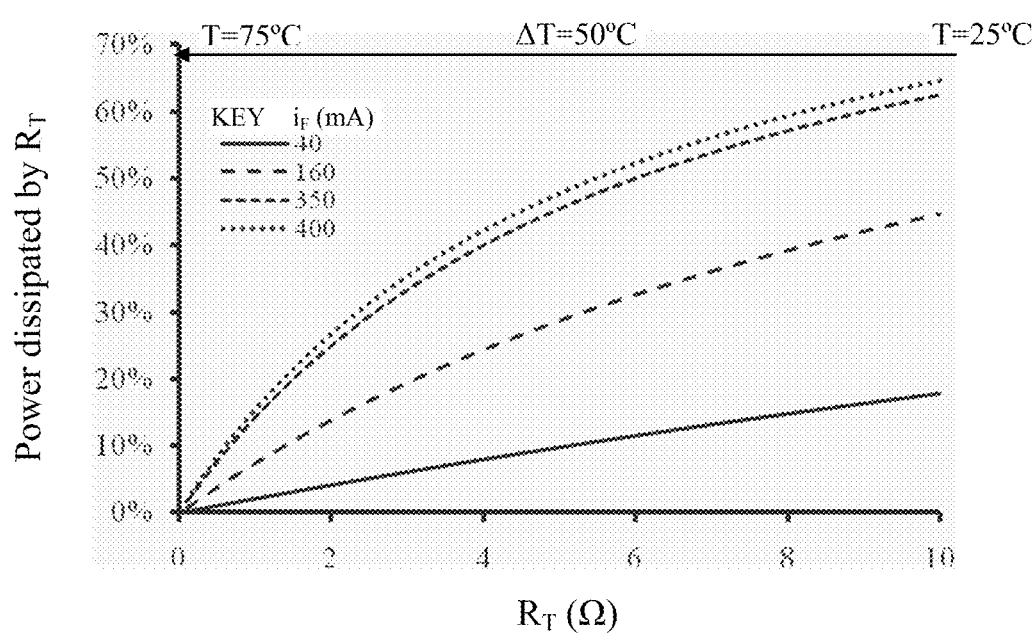

As shown in FIGS. 5c and 5d whilst a higher resistance thermistor has the capability of adjusting the forward current by a greater amount it will dissipate (consume) a greater proportion of the total power. For example at 25° C. approximately 65% of the total power will be dissipated by the thermistor for an LED driven with a forward drive current of 350 mA or 400 mA. As a result a balance has to be struck between these two effects (amount of current adjustment versus thermistor power consumption). For example if the LED chip is under driven with a drive current of 40 mA using a 5Ω (@25° C.) thermistor a maximum of 10% of the total power is dissipated by the thermistor and the current $i_F$ can be adjusted by up to 15%. For an LED chip driven with a drive current of 160 mA and driven by a 2.2Ω thermistor a maximum of up to 15% of the total power is consumed by the thermistor and $i_F$ can be adjusted by up to 13%. For a drive current of 160 mA driven using a 1.1Ω thermistor, the thermistor dissipated up to 15% of the total power and $i_F$ can be adjusted by up to 11%. It will be understood that the resistance of the thermistor and its temperature coefficient are selected according to the type of LED chip, the temperature characteristic of the LED chip and the interconnection of the LED chips (serial, parallel or a combination thereof). In a preferred solution the value of $R_T$ is selected such that the thermistor dissipates less than 15% of the total power but still offers a current adjustment (compensation) of >10%

Figure 5E:
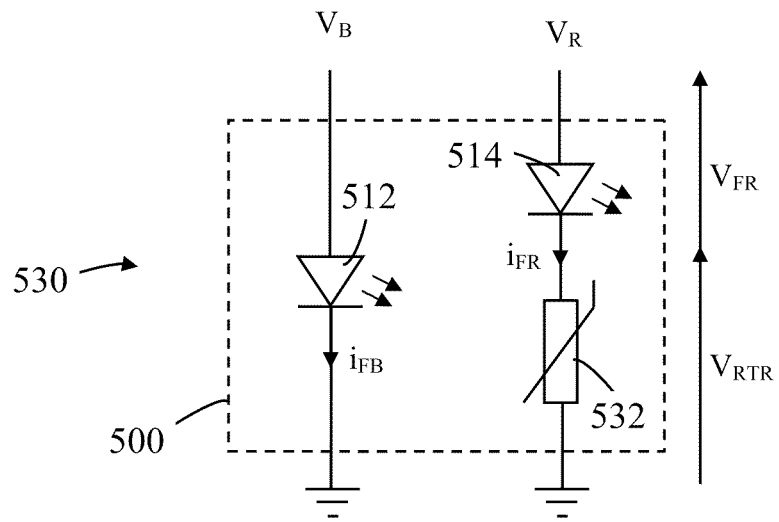
FIGS. 5e to 5j are constant voltage drive circuits for operating the devices of FIGS. 2 to 4.

FIG. 5e is a first drive circuit 530 in which the red LED chips 514 of the device 500 are connected in series with an NTC thermistor 532 and operated from a constant voltage source $V_R$ whilst the blue LED chips 512 are driven directly from a constant voltage source $V_B$. As described the resistance of the thermistor 532 depends on temperature and is operable to control the forward drive current $i_{FR}$ of the red LED chips in dependence on the operating temperature of the red and/or blue LED chips. For example in the light emitting devices 200, 300 (FIGS. 2 and 3) the thermistor 532 can be mounted in the recess 210, 310 of the package in thermal communication with the copper substrate 204, 304. In such an arrangement the thermistor 532 senses the temperature T of the substrate which is related to the operating temperature of the red and blue LED chips. In the light emitting device 400 (FIG. 4) the thermistor 532 can be mounted in thermal communication with the silver mounting pad 422 corresponding to the blue or red LED chips or mounted in thermal communication with the thermally conductive base 424.

As described above the intensity of light emitted by a red light emitting LED typically decreases much more quickly with an increase in operating temperature than the intensity of light emitted by a blue light emitting LED (FIG. 1a). In the circuit configuration of FIG. 5e the thermistor 532 has a negative temperature coefficient and the thermistor's resistance and temperature coefficient are selected to have a resistance/temperature characteristic that is related to the difference between the red and blue LED emission intensity/temperature characteristic. In operation when the temperature of the LED chips 512, 514 increases the resistance of the thermistor 532 decreases resulting in an increase of forward drive current $i_{FR}$ of the red LED chip 514. The change in the forward drive current $i_{FR}$ results in an increase in emission intensity of the red LED chips. The circuit 530 is configured to minimize any variation in the ratio of red to blue contributions in the emission product over the operating temperature range of the device and thereby reduce variation in the CCT and/or CRI of light emitted by the device. Ideally the circuit would be configured to maintain the relative contributions of red and blue light in the emission product constant over the operating temperature range. Since, over the operating temperature range of the device, it may not be practical to control the current of the LED sufficiently to maintain the ratio of red and blue light contributions in the emission product constant, in practice the circuit is configured to ensure that any variation in the relative contribution over the operating temperature range is less than a selected value, 20% or lower, preferably less than 10%, more preferably less than 5% and ideally 1% or lower. Since the circuit does not compensate for the decrease of emission intensity of the blue LED chips with increased temperature the overall emission intensity of the device will be lower at higher operating temperatures.

Figure 5F:
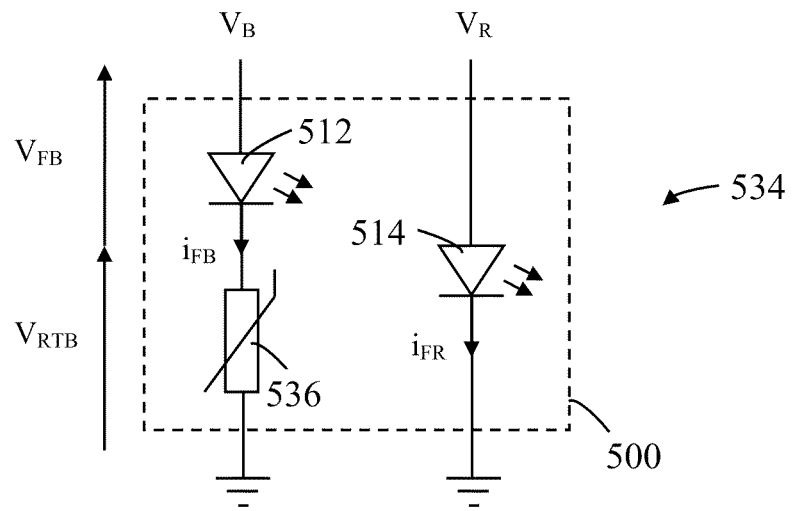

In an alternative drive circuit 534 as shown in FIG. 5f a thermistor 536 can be connected in series with the blue LED chip 512 and operated from a constant voltage source $V_B$ whilst the red LED chips driven from a constant voltage source $V_R$. The thermistor 536 is operable to measure the operating temperature of the red and/or blue LED chips. In the circuit configuration 534 the thermistor 536 preferably has a positive temperature coefficient (i.e. electrical resistance increases with increasing temperature) and the thermistor is selected to have a resistance/temperature characteristic that is related to the difference between the red and blue LED emission intensity/temperature characteristic. In operation when the temperature of the LED chips 512, 514 increases the resistance $R_T$ of the thermistor 536 increases resulting in an increase in total resistance ($R_T+V_F/i_F$) and a decrease of forward drive current $i_{FB}$ of the blue LED chip 512. The decrease of forward drive current results in a decrease in emission intensity of the blue LED chips. The circuit 534 is configured such that over the operating temperature range of the device the variation in the ratio (relative contribution) of light emission from the red and blue LED chips is less than a selected value thereby reducing the variation in the CCT and/or CRI of light emitted by the device. It will be appreciated however that whilst any variation in CCT and/or CRI is minimized the overall emission intensity of the device will decrease with increased operating temperature as the circuit does not compensate for the decrease of emission intensity of the red LED chips.

Figure 5G:
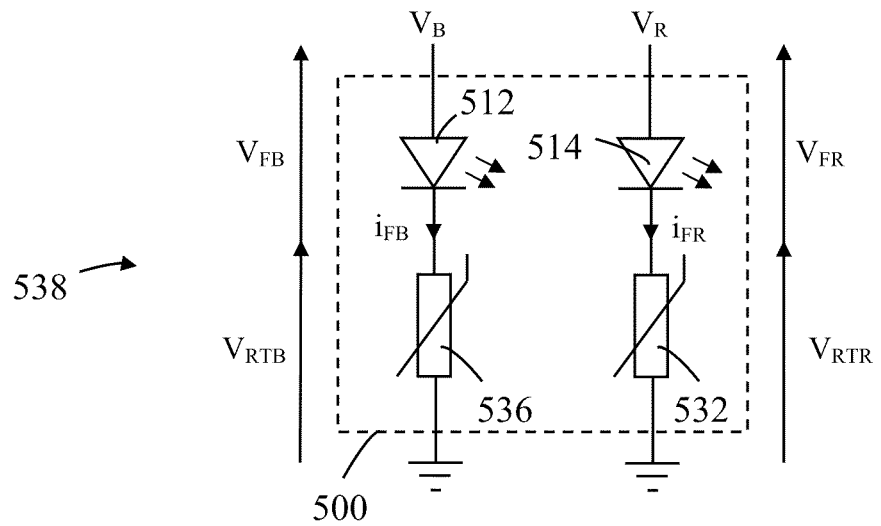

FIG. 5g shows a drive circuit 538 in which a respective thermistor 532, 536 is connected in series with the red and blue LED chips and used to independently control the forward drive current of the red and blue LED chips. The drive circuit 538 is a combination of circuits 530 (FIG. 5e) and 534 (FIG. 5f). Each thermistor 532, 536 can be operable to sense the operating temperature of a respective LED chip group or operable to measure the operating temperature of the red and blue LED chips.

In one arrangement of drive circuit 538 the thermistor 532 is a NTC device and the thermistor 536 is a PTC device. With such a configuration an increase of operating temperature will result in an increase of the forward drive current $i_{FR}$ of the red LED chip and a decrease of the forward drive current $i_{FB}$ of the blue LED chip. The net effect of the change of forward drive currents reduces any change in the ratio of light emission from the red and blue LED chips and thereby reduces the variation in the CCT and/or CRI of light emitted by the device. Whilst the CCT and/or CRI remain substantially constant the overall emission intensity will decrease due to the decrease of light emission from the blue LED chip. As described above (FIG. 5a), initial results indicate that a serially connected thermistor enables a maximum change of forward drive current of about 15% to 20% over a temperature range 25° C. to 75° C. (ΔT=50° C.). Over this temperature range the emission intensity of a red LED may drop by 40% whilst the emission intensity of the blue LED chip drops by about 5% (FIG. 1a) which is equivalent to a variation in the ratio of red to blue light of about 47%. By configuring the circuit to decrease the emission intensity of the blue LED chip and to increase the emission intensity of the red LED chip with increasing temperature enables the overall maximum change of drive current to be increased over a given operating temperature range. For example it is contemplated that such a configuration may be capable of an overall maximum change of drive about 30% to 40% over an operating temperature range of 25° C. to 75° C. thereby enabling the variation in the ratio of red to blue light to be minimized to a variation of approximately 7%.

In an alternative arrangement of drive circuit 538 both thermistors 532, 536 can be NTC devices and are selected to have a resistance/temperature characteristic that is related to the respective LED emission/temperature characteristic. With such a configuration an increase of operating temperature will result in an increase of the forward drive current of both the red LED and blue LED chips. Although such a circuit arrangement can additionally reduce any change of emission intensity, the variation in the CRI and CCT can be greater over the same operating temperature range.

Figure 5H:
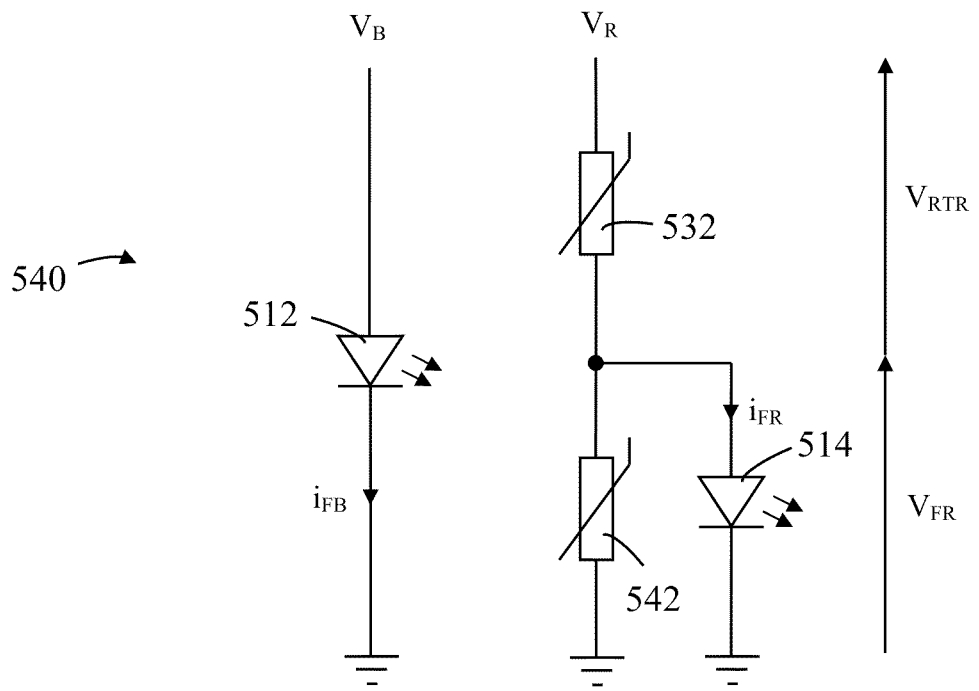

FIG. 5h show a further drive circuit 540 in which the forward drive current $i_{FR}$ of the red LED chips 514 is controlled in dependence on the LED chip temperature and the blue LED chips 512 are driven from a constant voltage source. In the configuration 540 the red LED chip 514 is connected in parallel with a PTC thermistor 542 of resistance $R_{TP}$ and the parallel combination connected in series with the NTC thermistor 532 of resistance $R_{TS}$ and operated from a constant voltage source $V_R$. The blue LED chips 512 are driven directly from a constant voltage source $V_B$. In operation when the temperature of the LED chips 512, 514 increases the resistance of the thermistor 532 decreases and the resistance of the thermistor 542 increases resulting in an increase of forward drive current $i_{FR}$ of the red LED chip 514. The forward drive current is given by the relationship:

$$i_{FR} = \frac{V_R - V_{FR}}{R_{TS}} + \frac{V_{FR}}{R_{TF}}$$

where $V_{FR}$ is the forward drive voltage of the red LED chips, $R_{TS}$ is the resistance of the thermistor 532 and is given by the relationship $R_{TS}=R_{OS}(1+K_s(T-T_0))$ and $R_{TP}$ is the resistance of the thermistor 542 and is given by the relationship $R_{TP}=R_{OP}(1+K_P(T-T_0))$. The change of forward drive current $i_{FR}$ with temperature is given by the relationship:

$$\frac{1}{i_{FR}}\frac{di_{FR}}{dT} = -\frac{K_S R_{0S} + \frac{1}{i_{FR}}\frac{\partial V_{FR}}{\partial T}\left(1+\frac{R_{TS}}{R_{TP}}\right) + \frac{V_{FR}}{i_{FR}}\frac{K_S R_{0S} - K_P R_{0P}\frac{R_{TS}}{R_{TP}}}{R_{TP}}}{R_{TS} + \frac{\partial V_{FR}}{\partial i_{FR}}\left(1+\frac{R_{TS}}{R_{TP}}\right)}.$$

To ensure that the thermistors 532, 542 do not consume too much of the total power (preferably ≤15%):

$$R_{TS} \ll V_{FR}/i_{FR} \ll R_{TP},$$

$R_{0S}/R_{TS} \approx R_{0P}/R_{TP}$, and $$\frac{\partial V_{FR}}{\partial T} \ll K_S R_{0S} i_{FR},$$

then the equation can be simplified to:

$$\frac{1}{i_{FR}}\frac{di_{FR}}{dT} \approx -\frac{K_S R_{0S} + \frac{V_{FR}}{i_{FR}}\frac{(K)_S - K_P(\square)R_{0S}}{R_{TP}}}{R_{TS} + \frac{\partial V_{FR}}{\partial i_{FR}}}$$

The change (increase) in the forward drive current $i_{FR}$ results in an increase in emission intensity of the red LED chip(s) 514. The circuit 540 is configured to ensure that the variation in the ratio (relative contribution) of light emission from the red and blue LED chips over the operating temperature range is within a selected range thereby reducing the variation in the CCT and/or CRI of light emitted by the device. Using two thermistors 532, 542 enables a greater change of forward drive current for a given change of temperature.

Figure 5I:
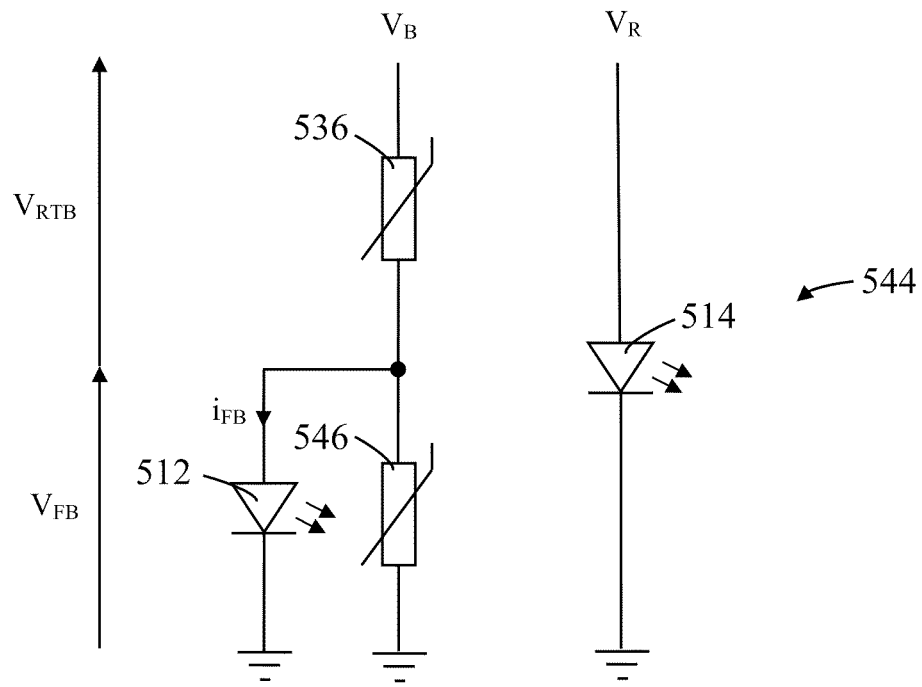

In an alternative drive circuit 544 as shown in FIG. 5i the forward drive current $i_{FB}$ of the blue LED chips 512 is controlled in dependence on the LED chip temperature and the red LED chip 514 driven from a constant voltage source. In the circuit configuration 544 the blue LED chip 512 is connected in parallel with a NTC thermistor 546 (resistance $R_{TP}$) and the parallel combination connected in series with a PTC thermistor 536 (resistance $R_{TS}$) and operated from constant voltage source $V_B$. The red LED chips 514 are driven directly from a constant voltage source $V_R$. In operation when the temperature of the LED chips 512, 514 increases the resistance of the thermistor 536 increases and the resistance of the thermistor 546 decreases resulting in an decrease of forward drive current $i_{FB}$ of the blue LED chip 512. The decrease in the forward drive current $i_{FB}$ results in a decrease in emission intensity of the blue LED chip 512. The circuit 544 is configured to maintain the relative contribution of red and blue light in the emission product substantially constant over the operating temperature range of the device and thereby reduce any variation in the CCT and/or CRI of light emitted by the device. As with the circuit configuration 534 (FIG. 5*f*) whilst the CCT and/or CRI remain substantially constant the overall emission intensity will drop with increasing temperature.

Figure 5J:
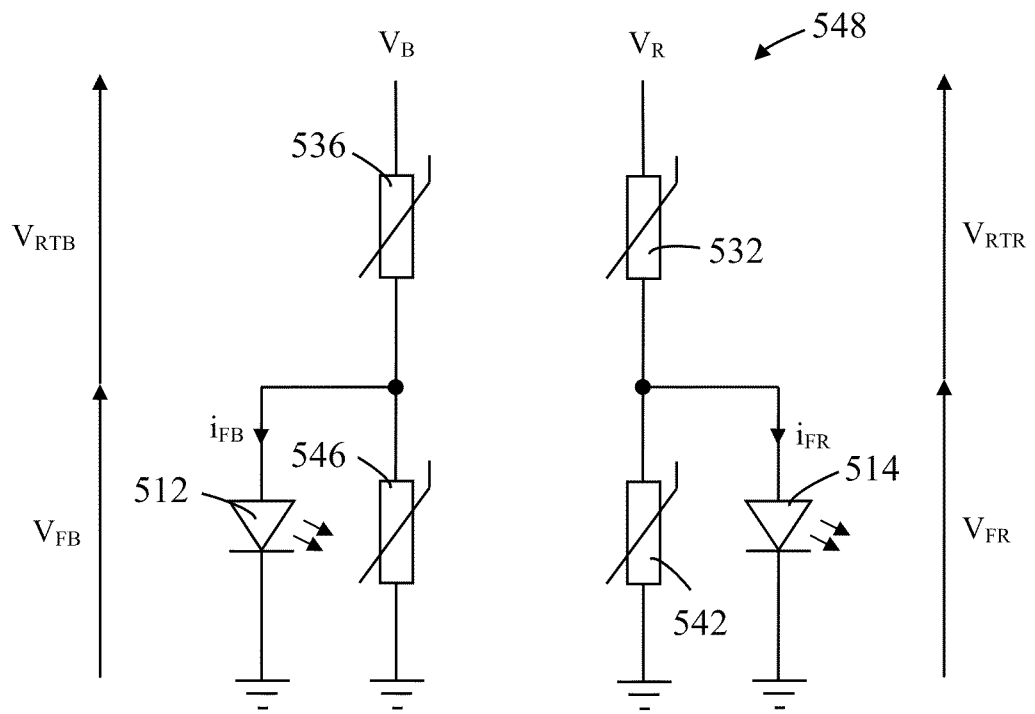

FIG. 5*j* shows a drive circuit 548 in which the forward drive currents $i_{FR}$, $i_{FB}$ of the red and blue LED chips are independently controlled in dependence on LED chip temperature. The circuit 548 is a combination of drive circuits 540 (FIG. 5*h*) and 544 (FIG. 5*i*) in which the red and blue LEDs chips are each connected in parallel with a respective thermistor 542, 546 and the parallel combination then connected in series with a respective thermistor 532, 536. Each pair of thermistors 532, 542 and 536, 546 can be operable to sense the operating temperature of a respective LED chip group or operable to measure the operating temperature of the red and blue LED chips.

In one drive circuit 548 arrangement the thermistors 532, 546 can be NTC devices and the thermistor 536, 542 can be PTC devices. With such a configuration an increase of operating temperature will result in an increase of the forward drive current $i_{FR}$ of the red LED chip and a decrease of the forward drive current $i_{FB}$ of the blue LED chip. The net effect of the change of forward drive currents $i_{FR}$, $i_{FB}$ reduces variation in the ratio of light emission from the red and blue LED chips and thereby reduces the variation in the CCT and/or CRI of light emitted by the device. Whilst the CCT and/or CRI may remain substantially constant the overall emission intensity will decrease due to the decrease of light emission from the blue LED chip. The thermistors can be selected to have a resistance/temperature characteristic that is related to the difference between the emission intensity/temperature characteristics of the red and blue LED chips.

In a further drive circuit 548 arrangement the thermistors 532, 536 can be NTC devices and the thermistors 542, 546 can be PTC devices. With such a configuration an increase of operating temperature will result in an increase of the forward drive currents $i_{FR}$, $i_{FB}$ of both the red and blue LED chips 514, 512. The thermistors can be selected to have a resistance/temperature characteristic that is related to the respective LED emission intensity/temperature characteristic.

Constant Current Drive Circuits

It is often preferred to drive LEDs in a constant current configuration in order to maintain a constant emission intensity. FIGS. 5*k* to 5*p* show various drive circuit configurations that are driven from a constant current source.

Figure 5K:
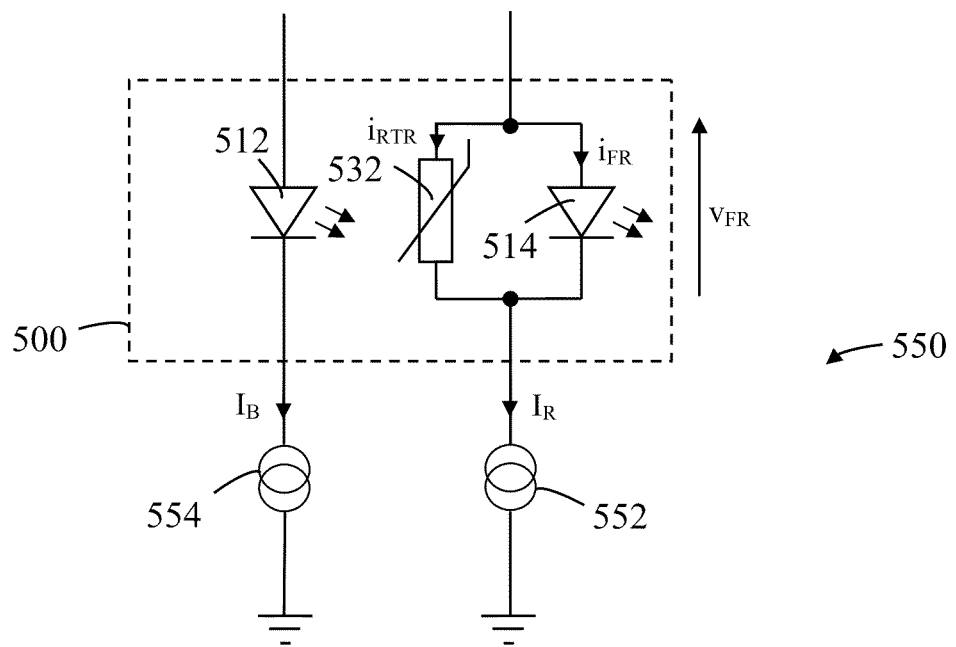
FIGS. 5k to 5p are constant current drive circuits for operating the devices of FIGS. 2 to 4.

In a first such drive circuit 550, as shown in FIG. 5*k*, the red LED chips 514 are connected in parallel with a PTC (positive temperature coefficient) thermistor 532 and operated from a constant current source 552 $I_R$ whilst the blue LED chips 512 are driven directly from a constant current source 554 $I_B$. The parallel thermistor/LED 532/514 configuration acts as a current divider such that in operation an increase in temperature causes the resistance of the thermistor to increase which results in a higher proportion of the current $I_R$ to flow through the arm including the red LED chip and an increase in the forward drive current $I_{FR}$ of the red LED chips. Assuming that the forward drive voltage $V_{FR}$ of the red LED chip is constant the forward drive current is given by the relationship:

$$i_{FR} = I_R - \frac{V_{FR}}{R_T}$$

where $R_T$ is the resistance of the thermistor 532 and given by the relationship $R_T = R_0(1+K(T-T_0))$. The change of forward drive current $i_{FR}$ with temperature is given by the relationship:

$$\frac{1}{i_{FR}} \frac{d i_{FR}}{dT} = \frac{\frac{V_{FR}}{i_{FR}} \frac{K R_0}{R_T} - \frac{1}{i_{FR}} \frac{\partial V_{FR}}{\partial T}}{R_T + \frac{\partial V_{FR}}{\partial i_{FR}}}.$$

In the drive circuit configuration 550 of FIG. 5*k* the thermistor 532 has a resistance and temperature coefficient that are selected to have a resistance/temperature characteristic that is related to the difference between the red and blue LED emission intensity/temperature characteristics. The circuit 550 is configured to minimize variation in the ratio (relative contribution) of red and blue light in the emission product over the operating temperature range and thereby reduce variation in the CCT and/or CRI of light emitted by the device.

Figure 5L:
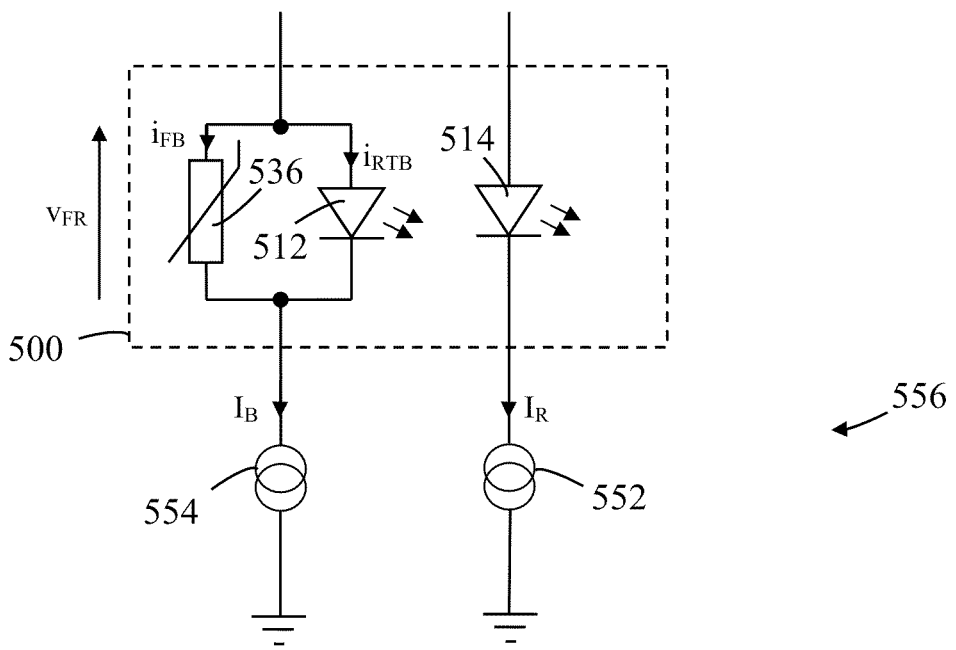

As shown in FIG. 5*l* in an alternative drive circuit 556 the blue LED chips 512 are connected in parallel with a NTC thermistor 536 and operated from a constant current source 554 $I_B$ whilst the red LED chips 514 are driven directly from a constant current source 552 $I_R$. In operation an increase in temperature causes the resistance of the thermistor 536 to decrease which results in a lower proportion of the current $I_B$ to flow through the arm including the blue LED chips and a decrease in the forward drive current $i_{FB}$ of the blue LED chips. The decrease of forward drive current results in a decrease in emission intensity of the blue LED chips. The thermistor 532 has a resistance and temperature coefficient that are selected to have a resistance/temperature characteristic that is related to the difference between the red and blue LED emission intensity/temperature characteristics. The circuit 556 is configured to minimize variation in the ratio of red and blue light in the emission product over the operating temperature range of the device and thereby reduce the variation in the CCT and/or CRI of light emitted by the device. It will be appreciated that whilst the CCT and/or CRI remain substantially constant the overall emission intensity of the device will fall with increasing temperature due to the decrease in emission intensity of the blue LED chip.

Figure 5M:
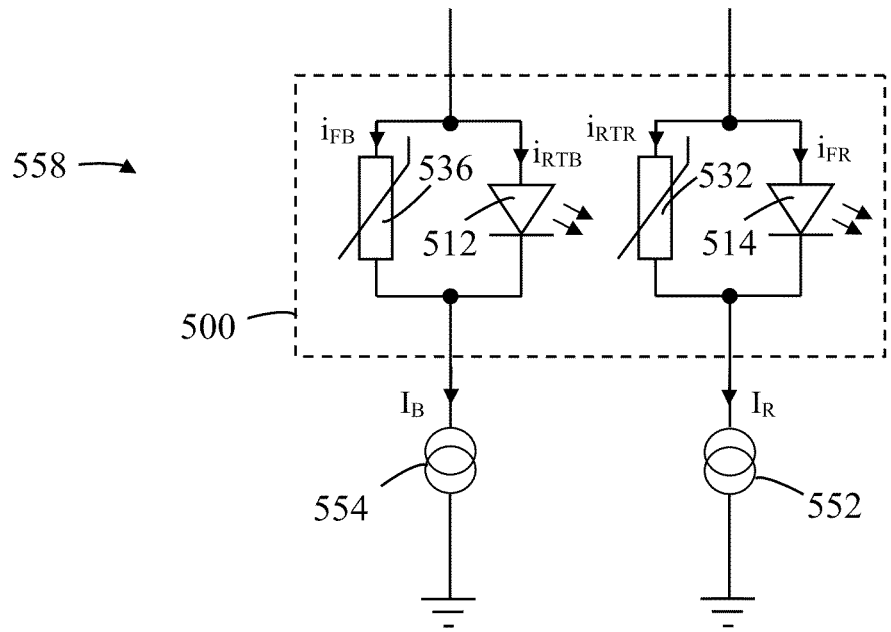

FIG. 5*m* shows a drive circuit 558 in which a respective thermistor 532, 536 is connected in parallel with the red and blue LED chips and used to independently control the forward drive current $i_{FR}$, $i_{FB}$ of the red and blue LED chips. The drive circuit 558 is a combination of circuits 550 (FIG. 5*k*) and 556 (FIG. 5*l*) In one such circuit configuration the thermistor 532 is a PTC device and the thermistor 536 is a NTC device. In an alternative configuration both thermistors 532, 536 are PTC devices and are selected to have a resistance/temperature characteristic that is related to the respective LED emission intensity/temperature characteristic.

Figure 5N:
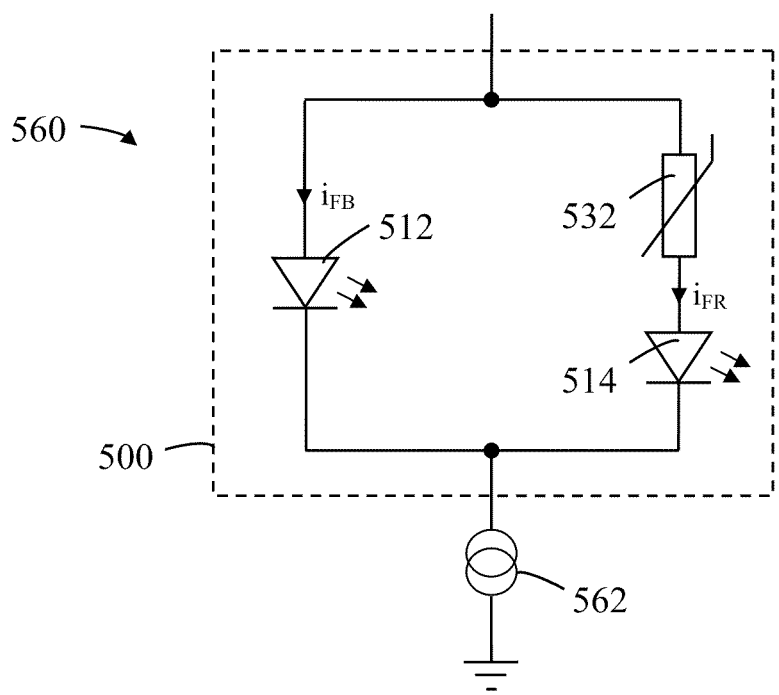

FIG. 5*n* is a drive circuit 560 in which the blue LED chips 512 and red LED chips 514 are connected in parallel and operated from a single constant current source 562. A thermistor 532 is connected in series in the arm of the circuit containing the red LED chips 514 and is operable to control the relative drive currents of the red and blue LED chips in dependence on the operating temperature of the red and/or blue LED chips. In the circuit configuration of FIG. 5n the thermistor 532 has a negative temperature coefficient and is selected to have a resistance/temperature characteristic that is related to the difference between the red and blue LED chip emission intensity/temperature characteristics. In operation when the temperature of the LED chips 512, 514 increases the resistance of the thermistor 532 decreases resulting in an increase of forward drive current $i_{FR}$ of the red LED chip 514 and a corresponding decrease of forward drive current $i_{FB}$ of the blue LED chip 512. The relative change in the forward drive currents results in an increase in emission intensity of the red LED chips and a decrease in emission intensity of the blue LED chips. The circuit 560 is configured to minimize variation in the relative contribution (ratio) of light emission from the red and blue LED chips and thereby reduce variation in the CCT and/or CRI of light emitted by the device 500.

Figure 5O:
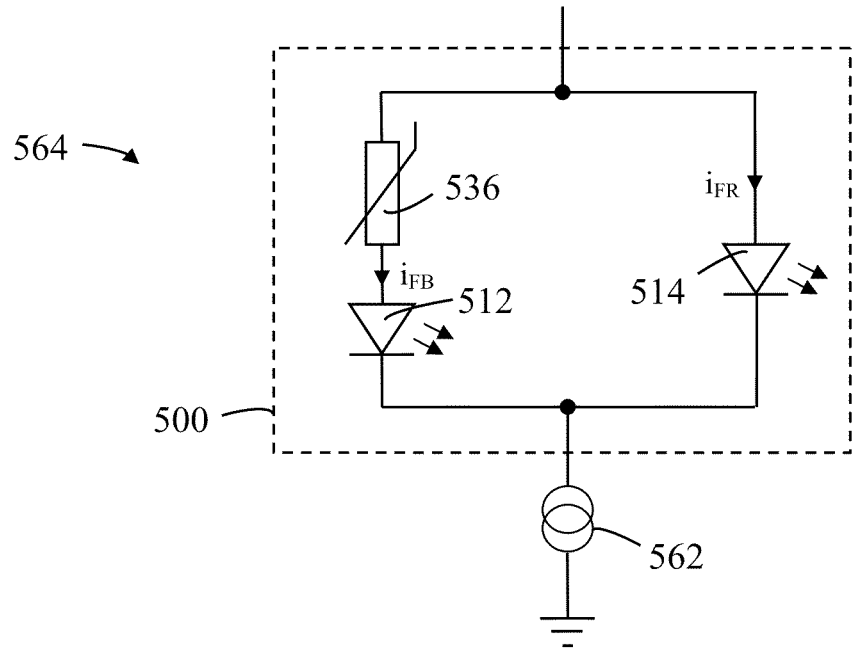

As shown in FIG. 5o in an alternative drive circuit 564 the thermistor 536 can be connected in the arm of the circuit containing the blue LED chip 512. The thermistor 536 is operable to measure the operating temperature of the red and/or blue LED chips. In the circuit configuration 564 the thermistor 536 has a positive temperature coefficient and is selected to have a resistance/temperature characteristic that is related to the difference between the red and blue LED emission/temperature characteristics. In operation when the temperature of the LED chips 512, 514 increases the resistance of the thermistor 536 increases resulting in a decrease of forward drive current $i_{FB}$ of the blue LED chip 512 and a corresponding increase of forward drive current $i_{FR}$ of the red LED chip 514. The change in the forward drive currents results in an increase in emission intensity of the red LED chips and a decrease in emission intensity of the blue LED chips. The circuit 564 is configured to minimize variation in the relative contribution of red and blue light contributions in the emission product over the operating temperature range of the device and thereby reduce variation in the CCT and/or CRI of light emitted by the device.

Figure 5P:
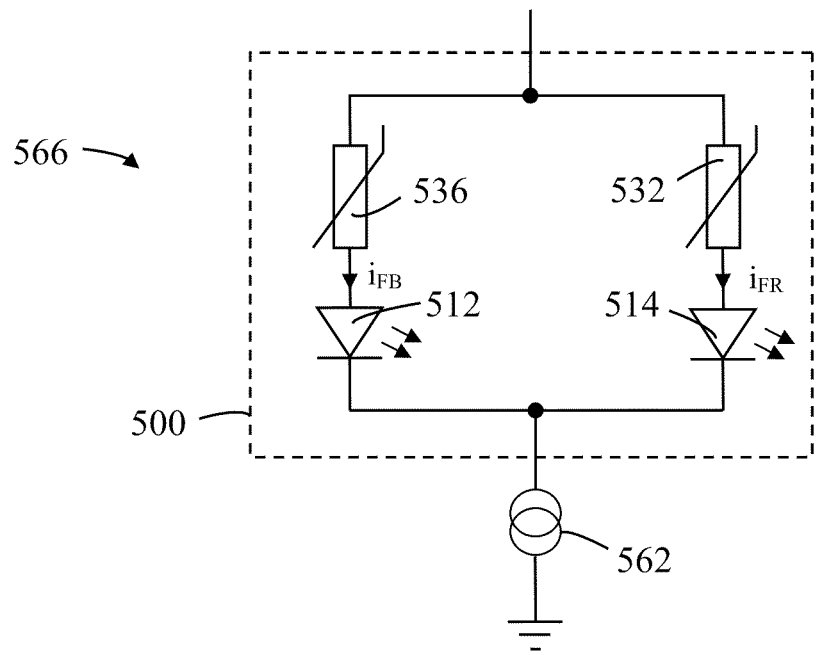

FIG. 5p shows a drive circuit 566 in which respective thermistors 532, 536 are used to control the forward current $i_{FR}$, $i_{FB}$ of the red and blue LED chips 514, 512. Each thermistor 532, 536 can be operable to sense the operating temperature of a respective LED chip group or operable to measure the operating temperature of the red and blue LED chips. In such a circuit configuration 566 the thermistor 532 is a NTC device and the thermistor 536 is a PTC device. In another circuit arrangement 566 both thermistors 532, 536 are NTC devices and are selected to have a resistance/temperature characteristic that is related to the respective LED emission intensity/temperature characteristic.

Controllable Current Drive Circuits

Figure 5Q:
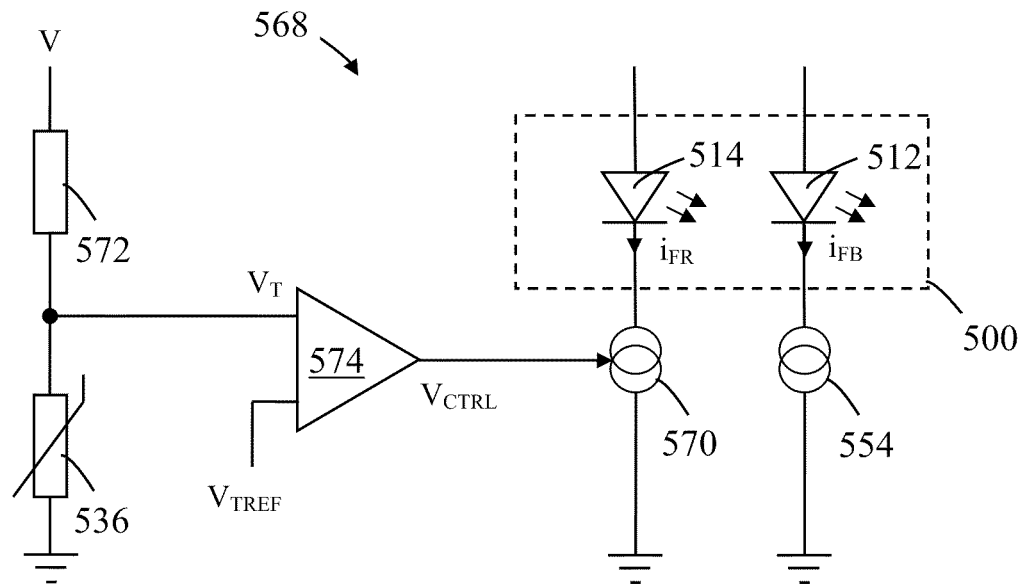
FIGS. 5q and 5r are controllable current drive circuits for operating the devices of FIGS. 2 to 4.

FIGS. 5q, 5r and 5t to 5x show various drive circuits based on a controllable current source(s). FIG. 5q shows a drive circuit 568 in which the blue LED chips 512 are driven directly from a constant current source 554 and the red LED chips 514 are driven from a controllable current source 570 whose current is controllable to compensate for changes in the LED chip operating temperature. A thermistor 536 is connected in series with one or more resistors 572 to form a potential divider arrangement such as to produce a voltage $V_T$ that is related to the temperature T of the thermistor 536. As illustrated in FIG. 5q the thermistor 536 is connected to ground and is a PTC device such that the voltage $V_T$ will increase with increasing temperature. The voltage $V_T$ is compared with a reference voltage $V_{TREF}$ using a voltage comparator 574 or like device. Typically the reference voltage $V_{TREF}$ is selected to be representative of the normal operating temperature of the LED chips. The comparator 574 produces an output voltage $V_{CTRL}$ that is related to the difference between the voltages $V_T$ and $V_{TREF}$ and hence related to the difference between the actual and normal operating temperatures. The control voltage $V_{CTRL}$ is used to control the controllable current source 570 and the forward drive current $i_{FR}$ of the red LED chips 514. Since the variation with temperature in emission intensity of the red LED chips 514 will be greater than that of the blue LED chips 512 it is only necessary to control the forward drive current of the red LED chips to minimize the variation in CCT and/or CRI of the device. It is however contemplated in other circuit configurations to alternatively control the forward drive current $i_{FB}$ of the blue LED chips or to independently control the forward drive current of the red and blue LED chips. In the case of the latter the thermistors 532, 536 can be configured to measure the temperature of a respective color of LED chip or to measure the temperature of the red and blue LED chips.

Figure 5R:
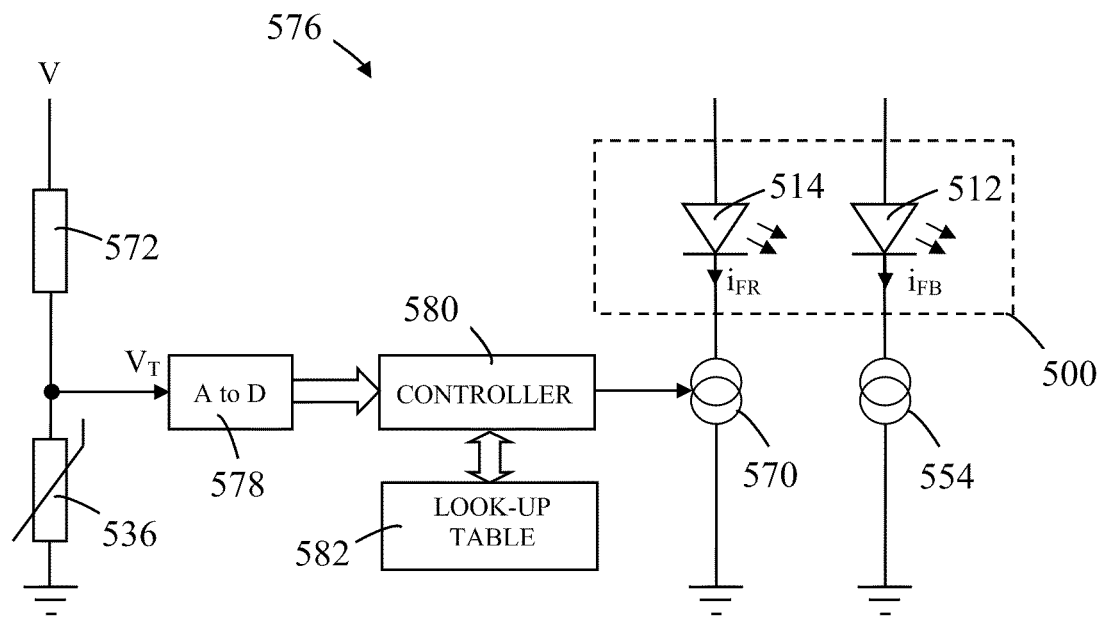

In a further drive circuit 576, as shown in FIG. 5r, the voltage $V_T$ corresponding to the operating temperature of the LED chip(s) can be converted into a digital value using an A to D (Analogue to Digital) converter 578 and the digital value used by a controller 580 to control a controllable current source 570. The circuit 576 can further comprise a look-up table 582 that the controller 580 accesses to determine the appropriate forward drive current to minimize the variation in the CCT and/or CRI of light emitted by the device 500. Since the configuration uses a look-up table containing values that can take account of the non-linear nature of the LED emission intensity/temperature characteristic the drive circuit 576 offers potentially very accurate control of the emission product of the device.

Figure 5S:
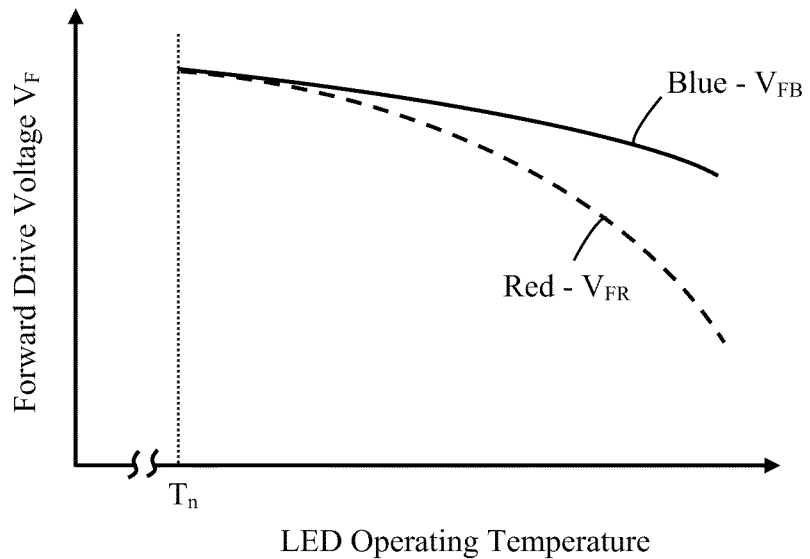
FIG. 5s is a schematic plot of normalized LED forward drive voltage $V_F$ versus operating temperature for blue and red light emitting LEDs.

In each of the drive circuits 530, 534, 538, 540, 544, 548, 550, 556, 558, 560, 564, 566, 568 and 576 described so far the operating temperature T of the LED chips has been measured using a resistive thermal device (thermistor). When an LED is operated in a constant current configuration the forward drive voltage $V_F$ is related to the operating temperature of the LED (FIG. 5s) and the inventors have appreciated that the LED forward drive voltage $V_F$ can be used as an indicator of LED operating temperature to control operation of the LED. The circuit configurations 584, 586, 592, 594 and 598 of FIGS. 5t to 5x operate in such a manner and eliminate the need to measure the LED chip temperature. A further advantage of using the forward drive voltage as an indicator of LED temperature is that all of the control circuitry can be located remote from the light emitting device.

Figure 5T:
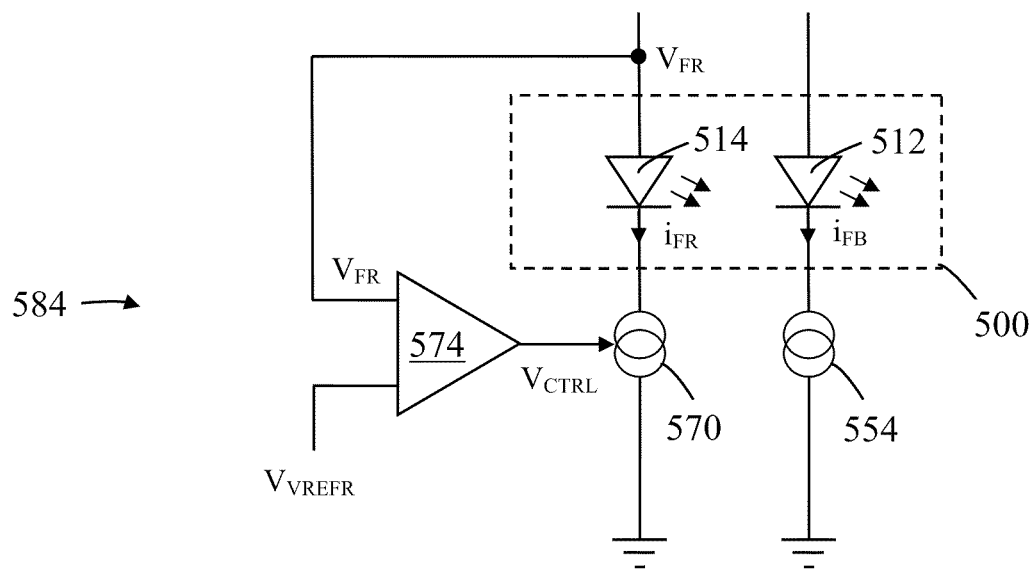
FIGS. 5t to 5x are controllable current drive circuits for operating the devices of FIGS. 2 to 4.

In the drive circuit 584 of FIG. 5t the blue LED chips 512 are driven from a constant current source 554 and the red LED chips 514 are driven from a controllable current source 570 whose current is controllable in dependence on the forward drive voltage $V_{FR}$ of the red LED chips to compensate for changes in the LED chip operating temperature. The forward drive voltage $V_{FR}$ is compared with a reference voltage $V_{VREFR}$ using a voltage comparator 574 or like device. Typically the reference voltage $V_{VREFR}$ is selected to be representative of the forward drive voltage at the normal operating temperature of the LED chip. The comparator 574 produces an output voltage $V_{CTRL}$ that is related to the difference between the voltages $V_{FR}$ and $V_{VREFR}$ and hence related to the difference between the actual and normal operating temperatures. The control voltage $V_{CTRL}$ is used to control the controllable current source 570 and the forward drive current $i_{FR}$ of the red LED chips 514.

Figure 5U:
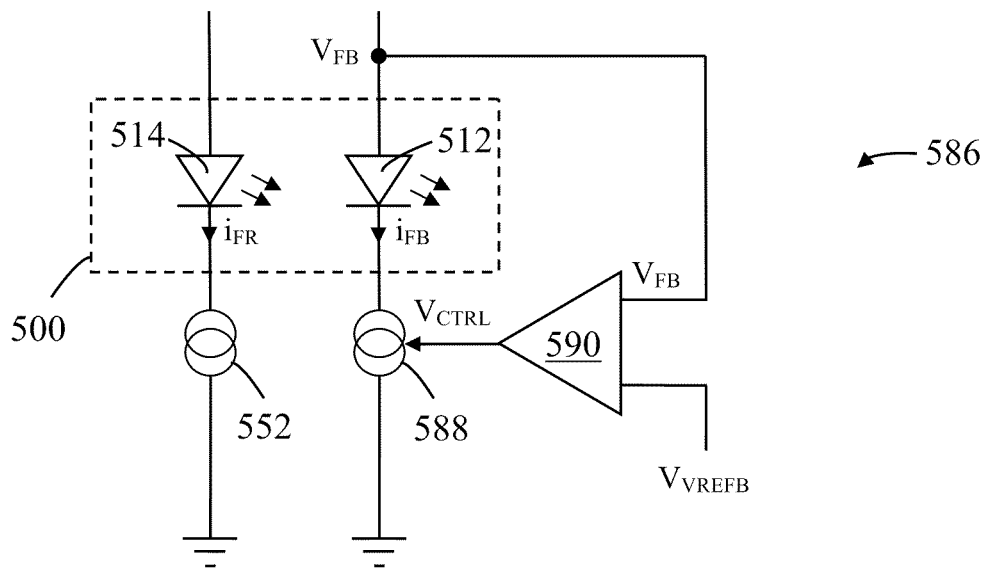

FIG. 5u shows a drive circuit 586 in which the red LED chips 514 are driven from a constant current source 552 and the blue LED chips 512 are driven from a controllable current source 588 whose current is controllable in dependence on the forward drive voltage $V_{FB}$ of the blue LED chips to compensate for changes in the LED chip operating temperature. The forward drive voltage $V_{FB}$ is compared with a reference voltage $V_{VREFB}$ using a voltage comparator 590 or like device. Typically the reference voltage $V_{VREFB}$ is selected to be representative of the forward drive voltage at the normal operating temperature of the LED chip. The comparator 590 produces an output voltage $V_{CTRL}$ that is related to the difference between the voltages $V_{FB}$ and $V_{VREFB}$ and hence related to the difference between the actual and normal operating temperatures. The control voltage $V_{CTRL}$ is used to control the controllable current source 588 and the forward drive current $i_{FB}$ of the blue LED chips 512.

Figure 5V:
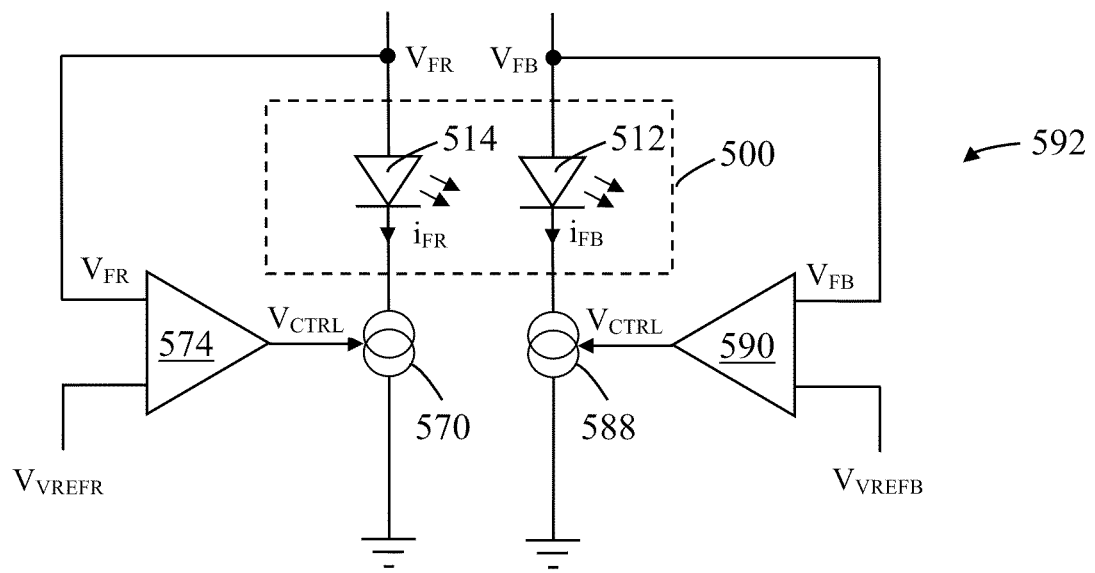

FIG. 5v shows a drive circuit 592 in which the red and blue LED chips 512, 514 are driven by a respective controllable current source 570, 588 whose current is controllable in dependence on the forward drive voltage $V_{FR}$, $V_{FB}$ of the red and blue LED chip(s) to compensate for changes in the LED chip operating temperature. The drive circuit 592 is a combination of drive circuits 584 (FIG. 5t) and 586 (FIG. 5u) and operates in a like manner.

Figure 5W:
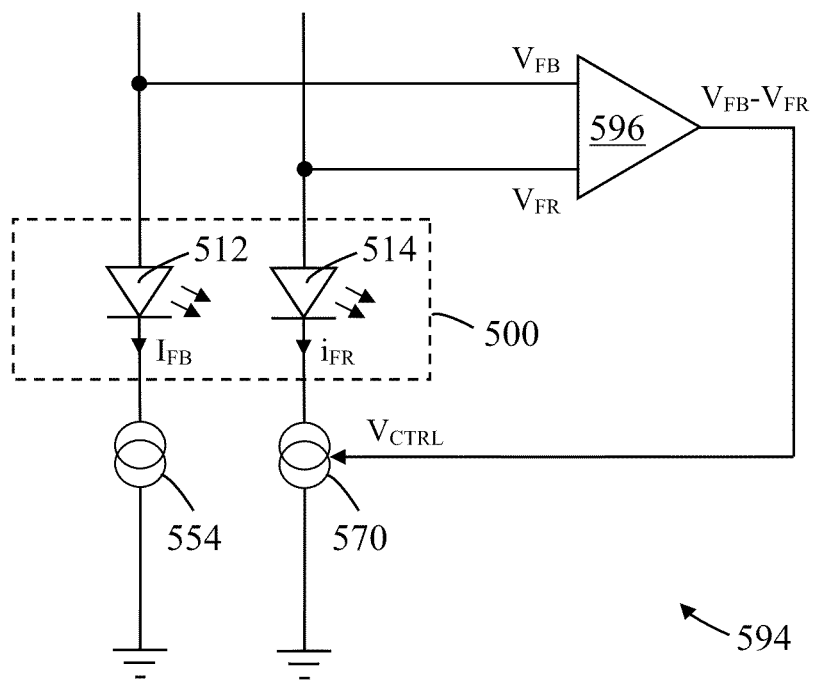

FIG. 5w shows a drive circuit 594 in which the blue LED chips 512 are driven from a constant current source 554 and the red LED chips 514 are driven from a controllable current source 570 whose current is controllable in dependence on a difference in forward drive voltage $V_{FB}-V_{FR}$ of the LED chip(s) 512, 514 to compensate for changes in the LED chip operating temperature. The forward drive voltages of the red and blue LED chips $V_{FR}$, $V_{FB}$ are compared by a voltage comparator 596 or like device which produces an output voltage that is related to the difference between the forward drive voltages $V_{CTRL}=V_{FB}-V_{FR}$ and hence related to relative drop of emission intensity of the red LED chips compared with the emission intensity of the blue LED chips (i.e. change of ratio of emission intensity).

Figure 5X:
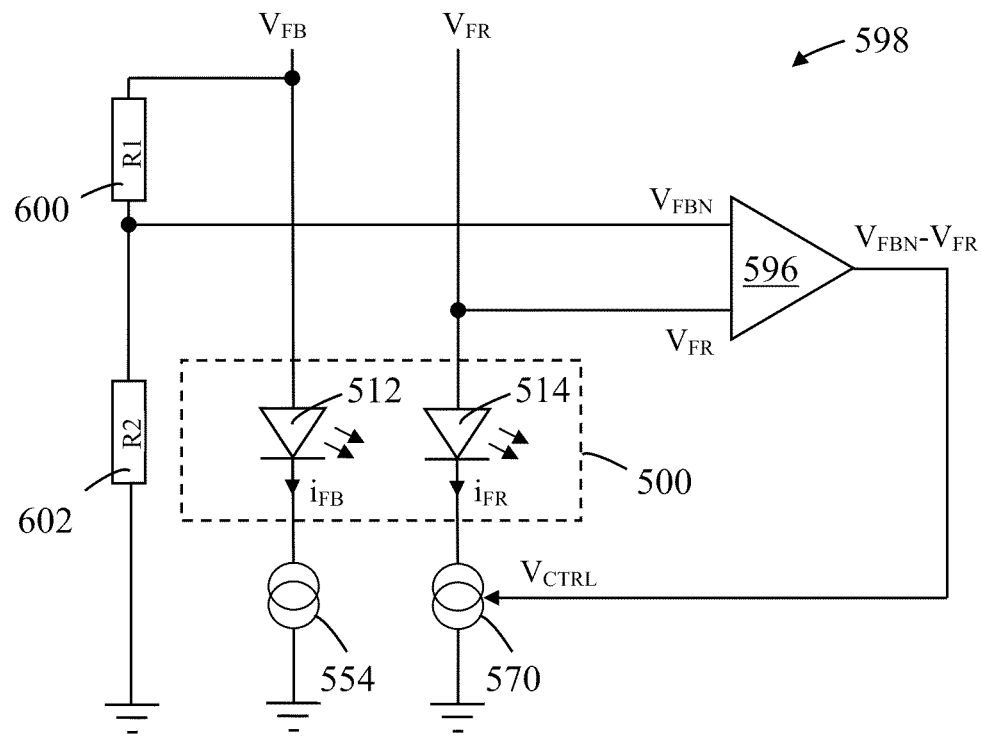
Figure 5Y:
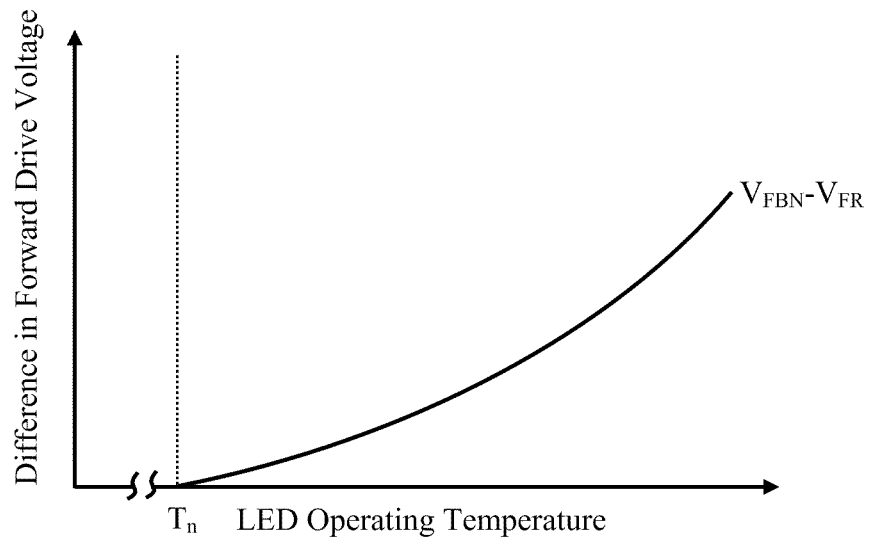
FIG. 5y is a schematic plot of difference in LED forward drive voltage $V_{FB}$-$V_{FR}$ versus operating temperature for blue and red light emitting LEDs.

FIG. 5x is a drive circuit 598 that is similar to the drive circuit 594 except that it is configured such that the forward drive voltages $V_{FB}$ and $V_{FR}$ used to control the current source are normalized such that they are equal at the normal operating temperature $T_n$ of the device. A potential divider arrangement comprising resistors R1 600 and R2 602 is configured such that at the normal operating temperature $T_n$ the normalized forward drive voltage for the blue LED chips $V_{FBN}$ is equal to the forward drive voltage of the red LED chips $V_{FR}$ and is given by the relation:

$$V_{FBN} = V_{FR} = V_{FB}\frac{R1}{R1+R2} @ T_n$$

Such a circuit arrangement ensures that the control voltage $V_{CTRL}=V_{FBN}-V_{FR}$ is zero at the normal operating temperature $T_n$. FIG. 5y is a schematic plot of the control voltage $V_{FBN}-V_{FR}$ versus LED operating temperature. The control voltage $V_{CTRL}$ is used to control the controllable current source 570 and the forward drive current $i_{FR}$ of the red LED chips to thereby maintain the relative contribution of light emission from the red and blue LED chips substantially constant thereby reducing the variation in the CCT and/or CRI of light emitted by the device 500.

In each of the drive circuits of FIGS. 5e to 5g, 5k to 5r and 5t to 5x the light emitting device 500 is indicated by a dashed line box and comprises at least one blue LED chip 512 and at least one red LED chip 514. It is envisaged that the light emitting device of the invention incorporate part or all of the drive circuitry described. Moreover it will be appreciated that the foregoing drive circuits are exemplary only and that other circuit configurations embodying the invention will be apparent to those skilled in the art.

The light emitting devices and drive circuits of the invention are exemplary only and are not restricted to the specific embodiments described and variations can be made that are within the scope of the invention. For example, devices in accordance with the invention can comprise other LEDs such as silicon carbide (SiC), zinc selenide (ZnSe), indium gallium nitride (InGaN), aluminum nitride (AlN) or aluminum gallium nitride (AlGaN) based LED chips that emit blue or U.V. light.

As an alternative to incorporating the phosphor material in the lens it is also envisaged to provide the phosphor material in the form of one or more layers on a surface of the lens, typically the planar face. In such an arrangement the phosphor material, which is typically in powder form, is mixed with a binder material such as NAZDAR's clear screen ink 9700 and the mixture screen printed on the surface of the lens to form a layer of uniform thickness. It will be appreciated that the phosphor can be applied by other deposition methods such as spraying, ink jet printing or by mixing the powdered phosphor with a light transmissive binder material such as an epoxy or silicone and applying the phosphor/polymer mixture by doctor blading, spin coating etc. To protect the phosphor material the lens is preferably mounted with the phosphor layer(s) facing the recess. Typically the weight loading of phosphor material to light transmissive binder in the deposited material is between 10% and 30% though it can range between 1% and 99% depending on the desired emission product and the package design. To deposit a sufficient density of phosphor material per unit area, for example 0.02-0.04 g/cm$^2$, it may be necessary to make multiple print passes, the number of passes depending on the mesh size of the printing screen.

What is claimed is:

1. A white light emitting device comprising:
    at least one blue solid state light emitter operable to generate blue light with a dominant wavelength in a range 400 nm to 480 nm;
    at least one phosphor material operable to absorb a portion of the blue light and to emit light with a dominant wavelength in a range 490 nm to 590 nm; and
    at least one red solid state light emitter operable to generate red light with a dominant wavelength in a range 600 nm to 700 nm, wherein
        an emission product of the white light emitting device comprises combined light generated by the blue and red light emitters and light generated by the at least one phosphor material and appears white in color; and
    a drive circuit operable to compensate for variation in a ratio of red to blue light in the emission product such that over an operating temperature range of at least 25° C., said variation is less than 20%.

2. The device of claim 1, wherein the drive circuit is configured such that in operation over the operating temperature range said variation is selected from the group consisting of being: less than 10%, less than 5% and less than 1%.

3. The device of claim 1, wherein the drive circuit is configured for operation over an operating temperature range selected from the group consisting of being: at least 25° C., at least 50° C. and at least 100° C.

4. The device of claim 1, and configured such that the emission product has a color rendering index selected from the group consisting of being: at least 80, at least 85, at least 90 and at least 95.

5. The device of claim 1, wherein the drive circuit is operable to control the power of at least one of the red and blue light emitters in response to a parameter related to the operating temperature of at least one of the blue and red light emitters.

6. The device of claim 5, wherein the parameter comprises a temperature of at least one of the blue and red light emitters.

7. The device of claim 6, and further comprising a sensor for sensing the temperature of the red and/or blue light emitters.

8. The device of claim 7, wherein the blue and red light emitters are mounted in thermal communication with a thermally conductive substrate and wherein the sensor is configured to sense the temperature of the substrate.

9. The device of claim 7, wherein the sensor comprises a temperature dependent resistor.

10. The device of claim 9, wherein the blue and red light emitters are connected in parallel and driven from a constant current source and wherein the temperature dependent resistor has a negative temperature coefficient and is connected in series with the at least one red light emitter and configured such that in operation the drive current of the at least one red light emitter increases relative to the drive current of the at least one blue light emitter with increasing temperature.

11. The device of claim 9, wherein the blue and red light emitters are connected in parallel and driven from a constant current source and wherein the temperature dependent resistor has a positive temperature coefficient and is connected in series with the at least one blue light emitter and configured such that in operation the drive current of the at least one blue light emitter decreases relative to the drive current of the at least one red light emitter with increasing temperature.

12. The device of claim 9, wherein the blue and red light emitters are connected in parallel and driven from a constant current source and comprising a respective temperature dependent resistor connected in series with the blue and red light emitters.

13. The device of claim 7, wherein at least one of the blue and red light emitters is connected in series with a temperature dependent resistor and said light emitter is operable from a constant voltage source.

14. The device of claim 13, wherein the temperature dependent resistor has a negative temperature coefficient and is connected in series with the at least one red light emitter.

15. The device of claim 13, wherein the temperature dependent resistor has a positive temperature coefficient and is connected in series with the at least one blue light emitter.

16. The device of claim 13 wherein the blue and red light emitters are connected in series with a respective temperature dependent resistor.

17. The device of claim 7, wherein at least one of the blue and red emitters is connected in parallel with the temperature dependent resistor and said light emitter is operable from a constant current source.

18. The device of claim 17, wherein the temperature dependent resistor has a positive temperature coefficient and is connected in parallel with the at least one red light emitter.

19. The device of claim 17, wherein the temperature dependent resistor has a negative temperature coefficient and is connected in parallel with the at least one blue light emitter.

20. The device of claim 17 wherein the blue and red light emitters are connected in parallel with a respective temperature dependent resistor.

21. The device of claim 6, and comprising respective sensors for sensing the temperature of the blue and red light emitters.

22. The device of claim 6, wherein the drive circuit is operable to control the drive current of one or both light emitters in dependence on a difference between a measured temperature and a reference temperature.

23. The device of claim 22, wherein the drive circuit comprises a comparator operable to compare the measured and reference temperatures.

24. The device of claim 5, wherein the parameter comprises the forward drive voltage of at least one of the blue and red light emitters.

25. The device of claim 24, wherein the drive circuit is operable to control the drive current of one or both light emitters in dependence on a difference between a drive voltage and a reference voltage.

26. The device of claim 25, wherein the drive circuit comprises a comparator operable to compare the measured and reference voltages.

27. The device of claim 24, wherein the drive circuit is operable to control the drive current in dependence on a difference of forward drive voltages of the blue and red light emitters.

28. The device of claim 1, wherein the at least one phosphor material is physically separated from the at least one blue LED by a distance of at least 5 mm.

29. A white light emitting device comprising:
at least one blue LED operable to generate blue light;
at least one phosphor material operable to absorb a portion of the blue light and to emit green/yellow light; and
at least one red LED operable to generate red light, wherein an emission product of the white light emitting device comprises combined light generated by the blue and red light LEDs and green/yellow light generated by the at least one phosphor material and appears white in color; and
a drive circuit operable to compensate for variation in the ratio of red to blue light in the emission product such that over an operating temperature range of at least 25° C., said variation is less than 20%.

* * * * *